US008367309B2

(12) United States Patent  
Okuno et al.

(10) Patent No.: US 8,367,309 B2
(45) Date of Patent: Feb. 5, 2013

(54) PATTERN FORMATION METHOD USING LEVENSON-TYPE MASK AND METHOD OF MANUFACTURING LEVENSON-TYPE MASK

(75) Inventors: Mitsuru Okuno, Tokyo (JP); Akemi Moniwa, Tokyo (JP)

(73) Assignee: Renesas Electronics Corporation, Kanagawa (JP)

( * ) Notice: Subject to any disclaimer, the term of this patent is extended or adjusted under 35 U.S.C. 154(b) by 0 days.

(21) Appl. No.: 13/271,997

(22) Filed: Oct. 12, 2011

(65) Prior Publication Data

US 2012/0028194 A1 Feb. 2, 2012

Related U.S. Application Data

(60) Continuation of application No. 13/050,548, filed on Mar. 17, 2011, now Pat. No. 8,071,264, which is a continuation of application No. 12/699,330, filed on Feb. 3, 2010, now Pat. No. 7,935,462, which is a division of application No. 11/637,698, filed on Dec. 13, 2006, now Pat. No. 7,682,760.

(30) Foreign Application Priority Data

Dec. 15, 2005 (JP) ................................. 2005-361831

(51) Int. Cl.
*G03F 5/00* (2006.01)
(52) U.S. Cl. ........................................ 430/322; 430/394
(58) Field of Classification Search .............. 430/5, 322, 430/393, 394

See application file for complete search history.

(56) References Cited

U.S. PATENT DOCUMENTS

| 5,858,580 | A | 1/1999 | Wang et al. |
| 7,459,265 | B2 | 12/2008 | Ishibashi et al. |
| 2002/0177051 | A1 | 11/2002 | Kikuchi |
| 2006/0057473 | A1 | 3/2006 | Ishiwata et al. |

FOREIGN PATENT DOCUMENTS

| EP | 1 739 481 A1 | 1/2007 |
| JP | 01-283925 | 11/1989 |
| JP | 11-283904 | 10/1999 |
| JP | 2000-260701 | 9/2000 |
| JP | 2002-229181 | 8/2002 |
| JP | 2003-168640 | 6/2003 |
| JP | 2003-209049 | 7/2003 |
| JP | 2004-247606 | 9/2004 |
| WO | WO 2005/103820 A1 | 11/2005 |

OTHER PUBLICATIONS

Chinese Office Action, w/ English translation thereof, issued in Chinese Patent Application No. CN 200610173295.8 dated Aug. 4, 2010.
Japanese Notice of Grounds of Rejection, with English translation, issued in Japanese Patent Application No. 2005-361831, mailed Feb. 22, 2011.
Japanese Notice of Grounds of Rejection, w/ English translation thereof, issued in Japanese Patent Application No. JP 2005-361831 dated Jun. 21, 2011.

*Primary Examiner* — Stephen Rosasco
(74) *Attorney, Agent, or Firm* — McDermott Will & Emery LLP

(57) ABSTRACT

A method of forming a pattern including a first pattern portion having a first minimum dimension and a second pattern portion having a second minimum dimension includes a first exposure step of performing exposure using a Levenson-type mask and a second exposure step of performing exposure using a half tone-type mask. When second minimum dimension is 1.3 time or more than the first minimum dimension, the exposure amount of the second exposure step is set to be equal to or smaller than the exposure amount of the first exposure step.

4 Claims, 15 Drawing Sheets

OPTICAL IMAGE IN CASE OF EXPOSURE AMOUNT RATIO
(LEVENSON : HALF TONE = 1:1)

OPTICAL IMAGE IN CASE OF EXPOSURE AMOUNT RATIO
(LEVENSON : HALF TONE = 0.6:1)

PAIR : REFERS TO ONE SAME PHASE OPENING
       PORTION AND ONE REVERSE PHASE OPENING
       PORTION ARRANGED ON OPPOSITE SIDES OF
       ONE PATTERN TO FORM ONE PATTERN

PATTERN FORMATION METHOD USING LEVENSON-TYPE MASK AND METHOD OF MANUFACTURING LEVENSON-TYPE MASK

RELATED APPLICATIONS

This application is a Continuation of U.S. application Ser. No. 13/050,548, filed on Mar. 17, 2011 now U.S. Pat. No. 8,071,264, which is a Continuation of U.S. application Ser. No. 12/699,330, filed on Feb. 3, 2010, now U.S. Pat. No. 7,935,462, which is a Divisional of U.S. application Ser. No. 11/637,698, filed on Dec. 13, 2006, now U.S. Pat. No. 7,682,760, claiming priority of Japanese Patent Application No. 2005-361831, filed on Dec. 15, 2005, the entire contents of each of which are hereby incorporated by reference.

BACKGROUND OF THE INVENTION

1. Field of the Invention

The present invention relates to a pattern formation method and a method of manufacturing a Levenson-type mask.

2. Description of the Background Art

In semiconductor devices such as semiconductor integrated circuits, a photolithography technique may be used to form electrodes or interconnections. In a photolithography step, an exposure step is performed to expose a resist in a prescribed shape through a photomask. The resist is formed, for example, of a photosensitive resin and formed into a prescribed shape by performing development after the exposure step.

The mask used in the exposure step has a light transmitting portion and a light shielding portion. The photomask includes a phase shift mask for changing a phase of light transmitted through the light transmitting portion to increase a resolution. The phase shift mask includes a Levenson-type mask and a half tone-type mask. These photomasks use the interference action of light to increase a resolution.

In the Levenson-type mask, when a resist, which is for example positive, arranged on a surface of a substrate is processed into a prescribed shape, a light transmitting portion is formed on one side of opposite sides of a part to allow light to pass through and a light transmitting portion is formed on the other side to cause phase reversal with respect to the phase of light of the light transmitting portion on one side. The Levenson-type mask is a photomask formed such that the phases of light on opposite sides of a part are reverse to each other thereby improving the resolution at the part.

In the half tone-type mask, when a resist arranged on a surface of a substrate is processed into a prescribed shape, a light transmitting portion is formed in one of a part or a surrounding part of the part and a light-shielding portion is formed in the other, which allows light to partially pass through it and additionally reverses the phase, thereby improving the resolution at the above-noted part.

Japanese Patent Laying-Open No. 2002-229181 discloses a Levenson-type mask for forming a light shielding portion for isolated pattern element formation and a plurality of light shielding portions for forming periodic pattern elements on a transparent substrate. This Levenson-type mask has a phase shift portion and a light transmission portion arranged on opposite sides of the light shielding portion for isolated pattern element formation. A phase shift portion and a light transmitting portion are arranged on opposite sides of the light shielding portion for forming periodic pattern elements. The remaining part of the transparent substrate is covered with a light shielding portion. It is disclosed that the width of the phase shift portion for isolated pattern element formation is made approximately equal to the width of the phase shift portion for forming periodic pattern elements.

Japanese Patent Laying-Open No. 2003-168640 discloses a method of manufacturing a semiconductor device in which the phases of a fine line pattern formed by a phase shift mask and of a shifter pattern adjacent thereto in a certain range are reverse to each other. Preferably, at least four shifter patterns are provided with a fine line pattern formed by a phase edge interposed at the middle, and the adjacent shifter patterns are arranged to have opposite phases.

In photolithography, a method of performing exposures multiple times is known to form a fine part on a surface of a substrate.

For example, Japanese Patent Laying-Open No. 11-283904 discloses an exposure method including: a high-resolution exposure in which a pattern of a part difficult in line-width control is transferred using a phase shift pattern; and a normal exposure in which a pattern of a part easier in line-width control is transferred to a photoresist layer without using a phase shift pattern while the part of the photoresist layer to which the pattern has already been transferred by the high-resolution exposure is protected by a light-shielding portion of the mask pattern.

Furthermore, U.S. Pat. No. 5,858,580 discloses use of two mask processes. The first mask is a phase shift mask and the second mask is a single phase structure mask. The single phase structure mask allows exposure in such a manner that the region of the phase shift is not erased. In the single phase structure mask, an exposure is performed so as to avoid formation at the undesired part in a region other than the part formed by the phase shift mask.

In addition, Japanese Patent Laying-Open No. 01-283925 discloses an exposure method of patterning densely in a first region and patterning more coarsely than the first region in a second region. The first region is exposed by a mask pattern having a phase shift pattern to cause phase reversal of exposure light and the second region is exposed by a mask pattern having a light transmitting region and a non-transmitting region.

Japanese Patent Laying-Open No. 2004-247606 discloses a method of manufacturing a semiconductor device, in which in forming a gate comprised of a gate electrode and a gate interconnection, only a gate electrode pattern is formed by a double exposure process using a binary mask or a half tone mask as a first mask and a Levenson-type mask as a second mask, and thereafter a gate interconnection pattern is formed by an exposure process using a binary mask or a half tone mask as a third mask.

As described above, a phase shift mask or multiple exposure allows formation of a pattern including a part having a small minimum dimension. However, for example in a semiconductor device, further miniaturization is likely to be sought, and forming a fine pattern with high dimensional accuracy is currently desired.

In a Levenson-type mask, a light-shielding film such as a chrome film is arranged on a surface of a transparent substrate. An opening portion is formed to transmit light. The opening portion mainly includes a same phase opening portion and a reverse phase opening portion. The same phase opening portion is a region through which light is transmitted without a phase change and is formed of a main surface of the transparent substrate. In the reverse phase opening portion, a concave portion is formed or a shifter is arranged in the transparent substrate. The light passing through the reverse phase opening portion has its phase reversed.

Some Levenson-type masks including a concave portion in a transparent substrate as a reverse phase opening portion have an undercut portion formed such that the concave portion extends to below the end portion of a light-shielding film. In this Levenson-type mask, when the reverse phase opening portions are adjacent to each other, the undercut portions are adjacent to each other. With increased miniaturization of semiconductor devices, the distance between the undercut portions is reduced. As a result, the contact area between the light-shielding film arranged on the surface of the transparent substrate and the transparent substrate is reduced, so that the light-shielding film may sometimes strip away.

SUMMARY OF THE INVENTION

An object of the present invention is to provide a pattern formation method to allow formation of a fine pattern. Another object of the present invention is to provide a method of manufacturing a Levenson-type mask to allow formation of a fine pattern.

In accordance with an aspect of the present invention, a method of forming a pattern including a first pattern having a first minimum dimension and a second pattern having a second minimum dimension includes: a first exposure step of performing an exposure using a Levenson-type mask; and a second exposure step of performing an exposure using a half tone-type mask. When the second minimum dimension is at least 1.3 times the first minimum dimension, an exposure amount of the second exposure step is set to be at most an exposure amount of the first exposure step.

In accordance with another aspect of the present invention, a method of forming a pattern including a first pattern having a first minimum dimension and a second pattern having a second minimum dimension includes: a first exposure step of performing an exposure using a Levenson-type mask; and a second exposure step of performing an exposure using a half tone-type mask. When the second minimum dimension is at least 1.0 time and at most 1.1 times the first minimum dimension, an exposure amount of the second exposure step is set to be greater than an exposure amount of the first exposure step.

In accordance with an aspect of the present invention, a method of manufacturing a Levenson-type mask is provided. The Levenson-type mask includes a transparent substrate and a light shielding film arranged on a main surface of the transparent substrate and having a plurality of opening portions. The opening portion includes a same phase opening portion and a reverse phase opening portion. The reverse phase opening portion has a concave portion formed in the main surface. The concave portion has an undercut portion formed to extend to below an end portion of the reverse phase opening portion. The same phase opening portions and the reverse phase opening portions are set in pairs to form a first pattern in a processed object. The method includes an opening portion setting step of defining the same phase opening portion and the reverse phase opening portion on opposite sides of the first pattern. The opening portion setting step includes a step of setting the same phase opening portion in at least one of the opening portions that form pairs opposed to each other, in order of increasing distance between the pairs.

In accordance with another aspect of the present invention, a method of manufacturing a Levenson-type mask is used in manufacturing a semiconductor device having a first pattern formed in an active region of an element region and a second pattern formed in an element isolation region. The method includes an opening portion setting step of setting a same phase opening portion and a reverse phase opening portion as an opening portion on opposite sides of the first pattern. When the second pattern is arranged between regions exposed through the opening portions and a distance between the region exposed through the opening portion and the second pattern is at most such a distance that has a substantial effect on dimensional variations of the second pattern, the opening portion setting step includes a step of setting the same phase opening portion and the reverse phase opening portion on opposite sides of the second pattern, and an expansion step of expanding the same phase opening portion and the reverse phase opening portion to allow formation of the second pattern.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

Referring to FIG. 1 to FIG. 9, a pattern formation method in a first embodiment of the present invention will be described. In the present embodiment, a method of manufacturing a semiconductor device will be described by way of example. In the present embodiment, of phase shift masks, a Levenson-type mask and a half tone-type mask are used. Using the phase shift masks, exposures are performed multiple times.

Figure 1:
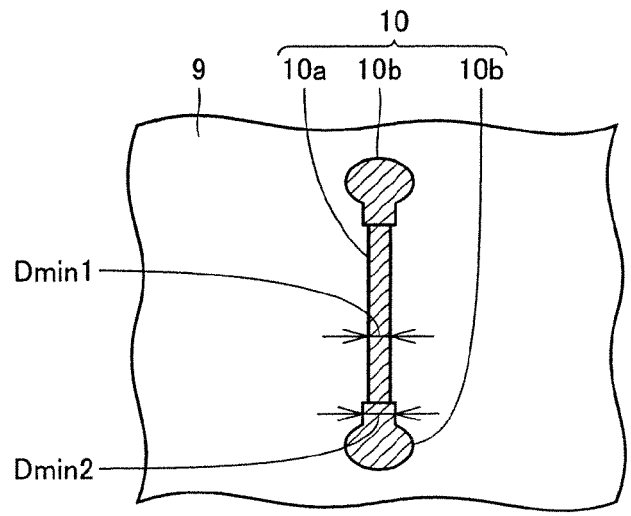
FIG. 1 is a schematic plan view of a resist pattern formed in a first embodiment.

FIG. 1 shows a schematic plan view of a pattern arranged on a surface of a processed object in the present embodiment. In the present embodiment, a resist pattern 10 is formed on a surface of a substrate 9 as a processed object. Substrate 9 in the present embodiment has a conductive film such as a polysilicon film arranged on a surface of a silicon wafer. In addition, an organic antireflection coating is deposited at a thickness of 80 nm on the surface of the polysilicon film. In the present embodiment, a resist formed on this organic antireflection coating is patterned. A resist pattern 10 is a photoresist formed at the surface of substrate 9. In the present embodiment, a positive resist is used.

Resist pattern 10 includes a first pattern portion 10a and a second pattern portion 10b. First pattern portion 10a is, for example, a portion that is a gate electrode of a field effect transistor. Second pattern portion 10b is, for example, a portion that is an interconnection portion for connecting the gate electrode. First pattern portion 10a is a pattern of a fine line or a part requiring dimensional accuracy. Second pattern portion 10b is a pattern having dimensions larger than first pattern portion 10a or requiring less dimensional accuracy than first pattern portion 10a.

In the present invention, the minimum dimension refers to the dimension of the distance (span) across a pattern, among the dimensions of a target pattern. First pattern portion 10a has a first minimum dimension $D_{min1}$. The first minimum dimension in the present embodiment is a width perpendicular to the direction in which first pattern portion 10a extends. Second pattern portion 10b has a second minimum dimension $D_{min2}$. The second minimum dimension in the present embodiment is a width of first pattern portion 10a. In the present embodiment, the first minimum dimension is formed to be smaller than the second minimum dimension.

A photolithography step is performed to form a photoresist having such a shape. In the photolithography step, for example, a resist film of a photosensitive resin arranged evenly on the surface of a conductive film serving as a processed film on a substrate is exposed and then developed so that the resist is left at a part of a desired shape. Furthermore, using the left resist as a mask, the processed film is etched thereby patterning the processed film in a desired shape.

In the present embodiment, an exposure for forming first pattern portion 10a is performed with a Levenson-type mask. An exposure for forming second pattern portion 10b is performed with a half tone-type mask.

Figure 2:
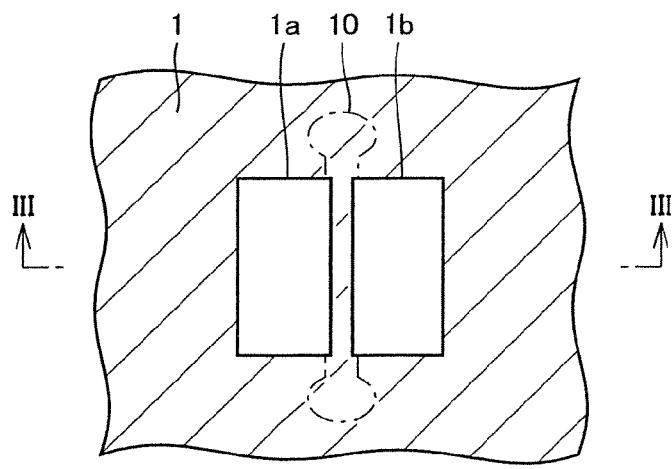
FIG. 2 is a schematic plan view of a Levenson-type mask in the first embodiment.
Figure 3:
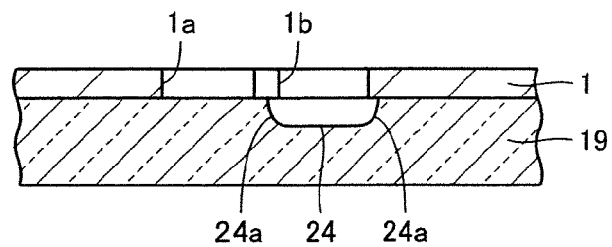
FIG. 3 is a schematic cross sectional view of the Levenson-type mask in the first embodiment.

FIG. 2 shows a schematic plan view of a Levenson-type mask in the present embodiment. FIG. 3 shows a cross sectional view taken along line as viewed from the arrow in FIG. 2.

The Levenson-type mask includes, for example, a transparent substrate 19 formed of silica glass or the like. A light shielding film 1 is arranged on a surface of transparent substrate 19 to block light. Light shielding film 1 is formed, for example, of a Cr film.

Light shielding film 1 has an opening portion as a light transmitting region to allow passage of light. In the present embodiment, the opening portion has a same phase opening portion 1a and a reverse phase opening portion 1b. Same phase opening portion 1a and reverse phase opening portion 1b are arranged on opposite sides of a part corresponding to first pattern portion 10a (see FIG. 1).

In same phase opening portion 1a, the surface of transparent substrate 19 is formed in a flat shape. The same phase region of the light transmitting region of the Levenson-type mask is formed of the main surface of transparent substrate 19. In reverse phase opening portion 1b, a concave portion 24 is formed at a surface of transparent substrate 19. The reverse phase region of the light transmitting region of the Levenson-type mask is formed of concave portion 24 formed at a surface of transparent substrate 19. Concave portion 24 is formed such that the phase of light passing through reverse phase opening portion 1b is reversed. For example, concave portion 24 is formed such that the light passing through reverse phase opening portion 1b has its phase shifted by 180° as compared with the light passing through same phase opening portion 1a.

Concave portion 24 in the present embodiment has an undercut portion 24a formed to improve dimensional accuracy. Undercut portion 24a is formed to extend to the inner side of the end portion in reverse phase opening portion 1b of light shielding film 1. In other words, light shielding film 1 has a portion serving as eaves at reverse phase opening portion 1b.

Although the Levenson-type mask in the present embodiment has a concave portion formed in a transparent substrate to reverse the phase of light, the present invention is not limited to such a manner. For example, a shifter for reversing the phase may be arranged at the reverse phase opening portion at the surface of the transparent substrate.

Figure 4:
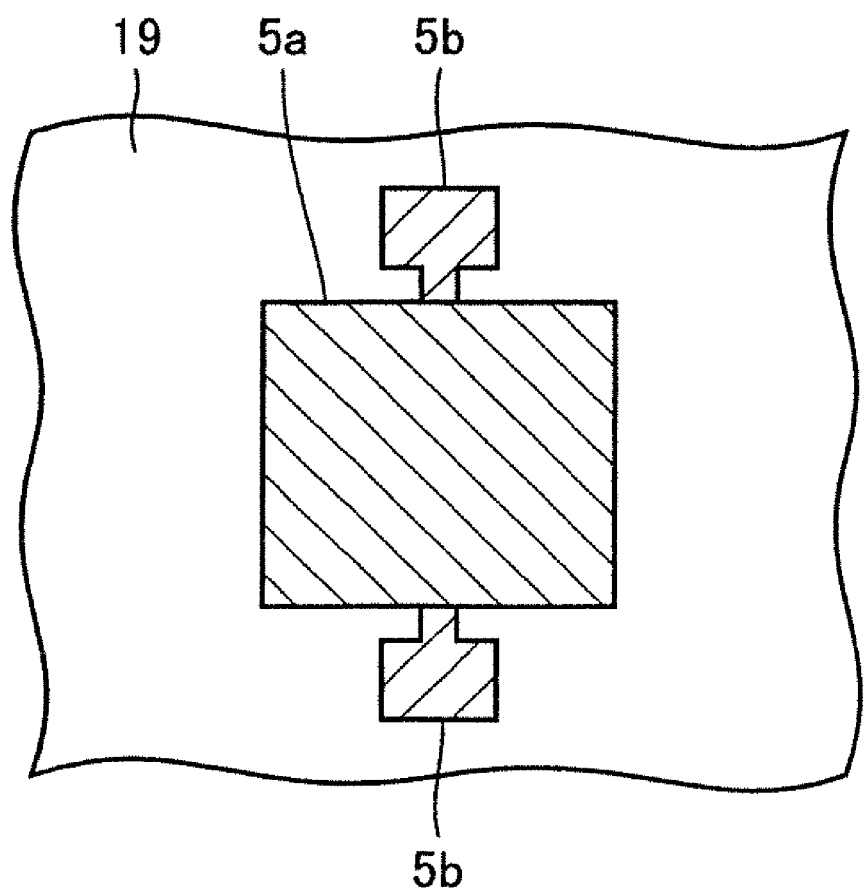
FIG. 4 is a schematic plan view of a half tone-type mask in the first embodiment.

FIG. 4 shows a schematic plan view of a half tone-type mask in the present embodiment. The half tone-type mask has a light shielding portion 5b at the surface of transparent substrate 19. Light shielding portion 5a is formed to completely block light. Light shielding portion 5a is formed, for example, of a Cr film. Light shielding portion 5a is formed such that the portion subjected to exposure using the Levenson-type mask is not subjected to exposure. Light shielding portion 5a is formed corresponding to the opening portion of the Levenson-type mask. A half tone portion 5b is arranged at the surface of transparent substrate 19 to form second pattern portion 10b (see FIG. 1) of resist pattern 10. Half tone portion 5b is formed corresponding to the shape of second pattern portion 10b of the resist pattern.

Half tone portion 5b in the present embodiment is formed to allow the light of exposure to be partially transmitted. Half tone portion 5b is formed such that the transmitted light has its phase reversed. Half tone portion 5b in the present embodiment includes a phase shifter arranged at the surface of transparent substrate 19. The half tone portion is not limited to the arrangement of a phase shifter and may be formed to allow a part of exposure light to be transmitted with its phase reversed.

Referring to FIG. 1, in the present embodiment, an exposure is performed so that the first minimum dimension $D_{min1}$ of first pattern portion 10a is smaller than the second minimum dimension $D_{min2}$ of second pattern portion 10b. In the present embodiment, resist pattern 10 is formed such that the second minimum dimension $D_{min2}$ is 1.3 times or greater than the first minimum dimension $D_{min1}$. Resist pattern 10 is formed such that the first minimum dimension $D_{min1}$ of first pattern portion 10a is 70 nm.

First, an acrylic-based positive resist is applied as a photosensitive resin at a film thickness of 180 nm on the surface of an organic antireflection coating. A pre-exposure heating treatment is performed on this resist film.

Next, a first exposure step is performed to form first pattern portion 10a. The first exposure step is exposure using the Levenson-type mask. In the first exposure step, the Levenson-type mask having same phase opening portion 1a and reverse phase opening portion 1b (see FIG. 2) is used.

In the first exposure step in the present embodiment, ArF excimer laser (wavelength of 193 nm) is used to perform an exposure on the resist film. The widths of same phase opening portion 1a and reverse phase opening portion 1b of light shielding film 1 of the Levenson-type mask in the present embodiment (see FIG. 2) are 140 nm each. The distance between same phase opening portion 1a and reverse phase opening portion 1b is 140 nm. Exposure is performed with this Levenson-type mask under the conditions of NA of 0.82 and Conv. ($\sigma$=0.40). Here, NA is numerical aperture. Conv. is a circular aperture stop of conventional illumination. Moreover, $\sigma$ is a ratio between illumination optical NA and projection lens system NA as viewed from the substrate (wafer).

Then, a second exposure step is performed to form second pattern portion 10b. The second exposure step is exposure using the half tone-type mask. In the second exposure step, exposure is performed using the half tone-type mask having light shielding portion 5a and half tone portion 5b (see FIG. 4).

In the second exposure step, the part of light shielding portion 5a in FIG. 4 blocks light. In other words, in the second exposure step, an exposure is performed such that the range subjected to the exposure in the first exposure step is not subjected to exposure again. In half tone portion 5b shown in FIG. 4, light is partially transmitted with its phase reversed.

In the present embodiment, a mask having a half tone portion having a transmittance of 6% is used. In the second exposure step, exposure was performed under the conditions of NA of 0.80 and Conv. ($\sigma$=0.85). The amount of exposure to the resist in the second exposure step is not more than the amount of exposure to the resist in the first exposure step. In other words, the exposure steps are performed in such a manner that the amount of exposure performed on the irradiated object such as a resist using the half tone-type mask is not more than the amount of exposure performed using the Levenson-type mask.

After the first exposure step and the second exposure step, the resist film was developed thereby forming a pattern as shown in FIG. 1. Although the first exposure step is followed by the second exposure step in the present embodiment, the second exposure step may be performed first. In other words, the exposure using the half tone-type mask may be performed first.

In the first exposure step, the light passing through same phase opening portion 1a has its phase unchanged for exposure. The light passing through reverse phase opening portion 1b has its phase reversed. At the part of first pattern portion 10a, interference of light takes place. This can prevent the part of first pattern portion 10a from being exposed and improve the dimensional accuracy in first pattern portion 10a. In other words, a fine first pattern portion 10a can be formed.

The present embodiment employs multiple exposure in which, of resist pattern 10, first pattern portion 10a is subjected to exposure using the Levenson-type mask and second pattern portion 10b is subjected to exposure using the half tone-type mask. In the multiple exposure, a latent image of the part first subjected to exposure may be influenced by fog of light in performing an exposure later.

For example, in the present embodiment, referring to FIG. 1, a latent image of first pattern portion 10a of resist pattern 10 is influenced when an exposure is performed later using the half tone-type mask. For example, if the amount of exposure in the second exposure step of performing an exposure using the half tone-type mask is too much, the dimensional accuracy of first pattern portion 10a may be deteriorated.

Figure 5:
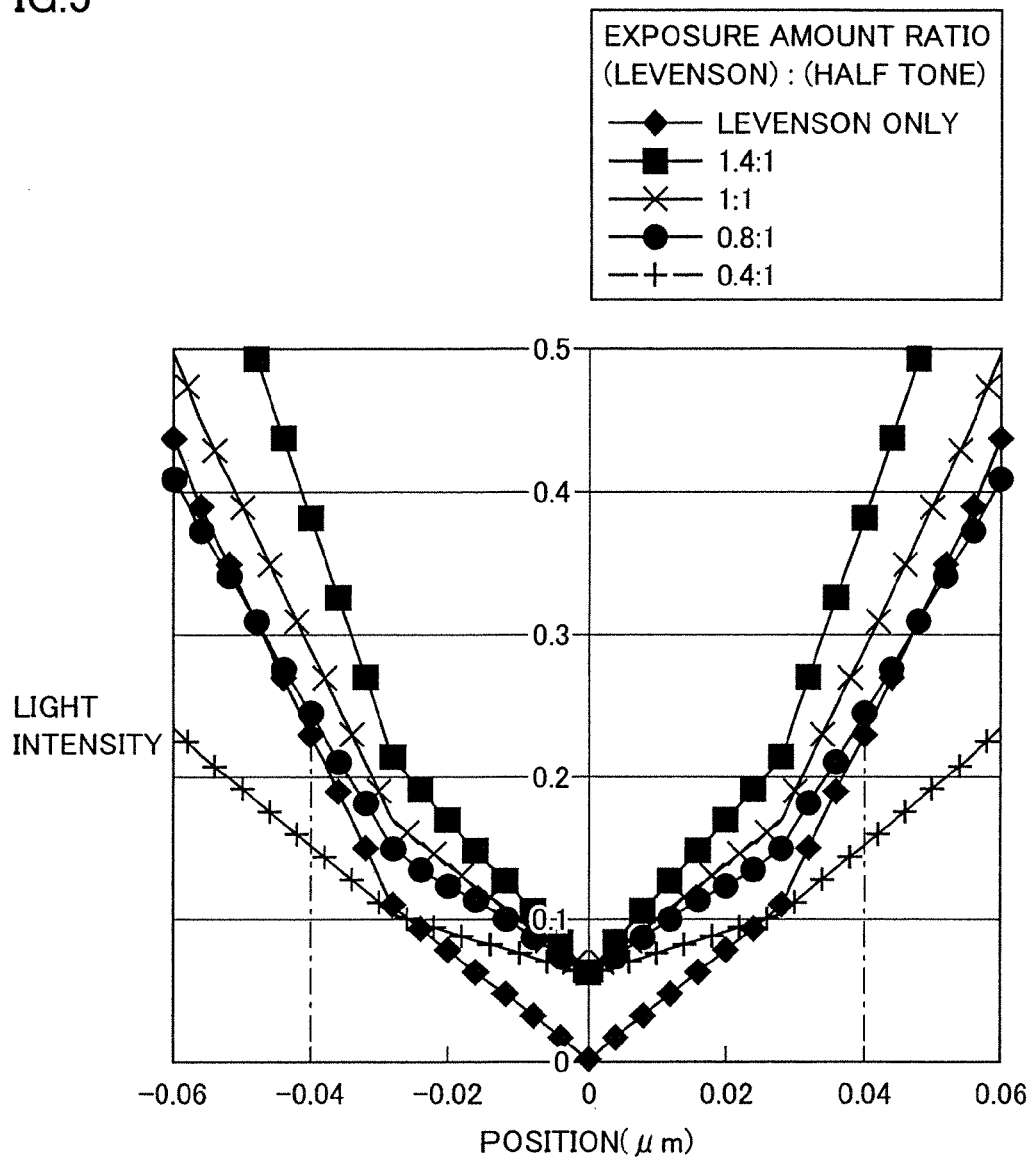
FIG. 5 is a graph illustrating the amount of exposure in the first embodiment.

FIG. 5 shows a graph of the result of an exposure test in the present embodiment. FIG. 5 is a graph of a composite optical image in first pattern portion 10a (see FIG. 1) of the resist pattern in the present embodiment. The axis of abscissas shows the distance from the center in the width direction of first pattern portion 10a to the outer side of the width direction. The location of 0 is the center in the width direction of the first pattern portion. The axis of ordinates shows the light intensity in the Levenson-type mask and the half tone-type mask.

In the exposure test, exposures were performed with various ratios between the exposure amounts of the Levenson-type mask and the half tone-type mask. The test was also conducted for exposure using only the Levenson-type mask.

Referring to FIG. 5, as the ratio of the exposure amount of the Levenson-type mask is smaller, the slope of the composite optical image becomes smaller, which suggests that the latent image is degraded. In other words, with the lower ratio of the exposure amount of the Levenson-type mask, the exposure of the half tone-type mask has greater effect and the dimensional accuracy is deteriorated.

For example, in the range where the distance from the center of the first pattern portion is greater than about 0.03 µm (in the range where the line width of the first pattern portion of the resist pattern is greater than 0.06 µm), in order to obtain a composite optical image with approximately the same slope as using only the Levenson-type mask, the exposure amount of the Levenson-type mask has to be at least 0.8 time or more than the exposure amount of the half tone-type mask. In addition, when the exposure amount of the Levenson-type mask is 1.0 time or more than the exposure amount of the half tone-type mask, the latent image having the dimensional accuracy equivalent to or higher than only using the Levenson-type mask can be obtained more reliably.

Here, ILS (Image Log Slope) value is employed as a basis to define the exposure amount ratio. ILS value shows the slope of logarithm of the image intensity and defined such that ILS value=$(1/Is) \times (\Delta I/\Delta x)$. Here, Is is a slice value and $(\Delta I/\Delta x)$ shows the gradient of the light intensity at the point of the slice value of the light intensity line.

In the present embodiment, a line width of 0.08 μm is used as a typical value for calculating a slice value. In a device with a design rule (design standard) of 65 nm, the line width of an electrode, interconnection or the like is about 60 nm or more and 70 nm or less. Based on that here the line width of the resist film is about 80 nm, a typical value of a line width is defined for calculating a slice value. In other words, this line width is a generic line width in a semiconductor device with a design rule of 65 nm. In this line width, the range from the center of the line width to the positions −0.04 μm or more and +0.04 μm or less therefrom is employed for slice values.

Figure 6:
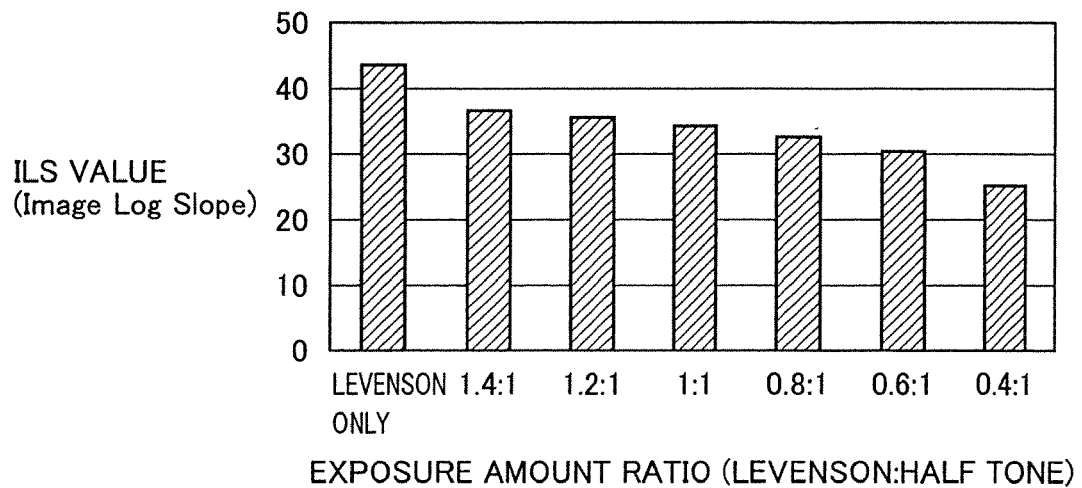
FIG. 6 is a graph illustrating ILS value in the first embodiment.

FIG. 6 shows a graph illustrating ILS values where the exposure amount ratio between the Levenson-type mask and the half tone-type mask is varied. The axis of abscissas shows the exposure amount ratio and the axis of ordinates shows the ILS value. As the exposure amount ratio of the Levenson-type mask is increased, the ILS value is increased. As described above, as can be seen from the graph in FIG. 5, if the exposure amount ratio between the Levenson-type mask and the half tone-type mask is 1:1, an excellent composite latent image can be obtained. In FIG. 6, the ILS value where the exposure amount ratio is 1:1 is about 0.8 time the ILS value only with the Levenson-type mask and is approximately 34. In other words, the ILS value of approximately 34 ensures the adequate slope of the exposure mount of the composite optical image, resulting in a first pattern portion with high dimensional accuracy. In other words, a minute first pattern portion can be formed.

As described above, the exposure amount of the Levenson-type mask is preferably 1.0 time or more than the exposure amount of the half tone-type mask. However, as the exposure amount ratio of the half tone-type mask is reduced, the dimensions of the light shielding portion of the half tone-type mask is reduced. As a result, the light shielding portion may be reduced in size below the mask manufacturing limit. With the size below the mask manufacturing limit, it becomes impossible to manufacture a mask. Considering manufacturing a mask, the exposure amount of the Levenson-type mask is more preferably 1.0 time or more and 1.2 times or less than the exposure amount of the half tone-type mask.

It is advantageous to set the exposure amount using the Levenson-type mask greater than the exposure amount using the half tone-type mask when the minimum dimension of the second pattern portion formed with the half tone-type mask is 1.3 times or greater than the minimum dimension of the first pattern portion formed with the Levenson-type mask. In the exposure step, the focus tolerance of an exposure apparatus may become a problem. More specifically, the dimensional variations in which the focusing of the exposure apparatus is varied may not fall within a permissible range. The problem of focus tolerance is conspicuous when the second minimum dimension is less than 1.3 times the first minimum dimension. If the second minimum dimension is 1.3 times or greater than the first minimum dimension, the exposure amount of the Levenson-type mask is set greater than the exposure amount of the half tone-type mask in order to form a first pattern portion with high dimensional accuracy. In other words, a minute first pattern portion can be formed. Moreover, advantageously, a line width can be shrunken in a method of manufacturing a semiconductor device with a design rule of 65 nm or less.

In the present embodiment, the exposure is performed in such a manner that the exposure amount of the Levenson-type mask is equal to or greater than the exposure amount of the half tone-type mask. Accordingly, the contrast of latent image at the part of the Levenson-type mask can be improved so that a minute semiconductor device can be provided. In other words, a semiconductor device with improved dimensional accuracy can be provided.

In order to reduce the exposure amount of the half tone-type mask, the intensity of light from a light source may be weakened, or the exposure time may be shortened. Besides, Optical Proximity Correction (OPC) may be employed.

Figure 7:
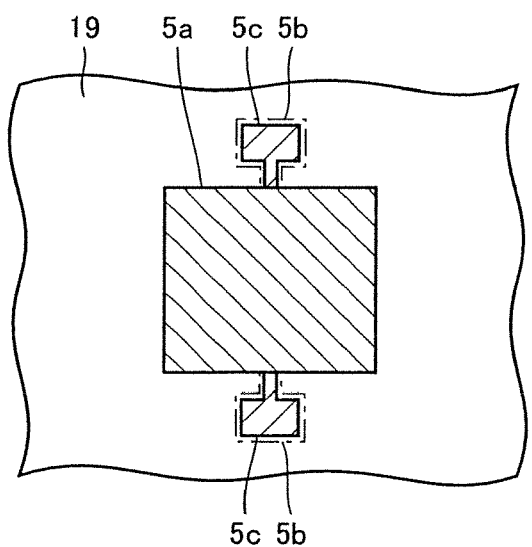
FIG. 7 is a schematic plan view where the exposure amount ratio of the half tone-type mask in the first embodiment is reduced.

FIG. 7 shows a schematic plan view of a half tone-type mask employing Optical Proximity Correction. In the half tone portion formed at the surface of transparent substrate 19, half tone portion 5b is reduced in size to form a half tone portion 5c. In this way, bias is set to reduce the size of the half tone portion, so that the amount of exposure for the irradiated object can be reduced. As a guide of a mask bias amount of the half tone portion, for example, in an isolated pattern with the distance between half tone portions of 2000 nm or more and the minimum width dimension of 70 nm as a basic pattern, the mask bias is set at 5 nm or more and 10 nm or less on either side.

The kind of resists used in the exposure step also influences the optical latent image. Now, the kinds of resists to be used will be described.

Figure 8:
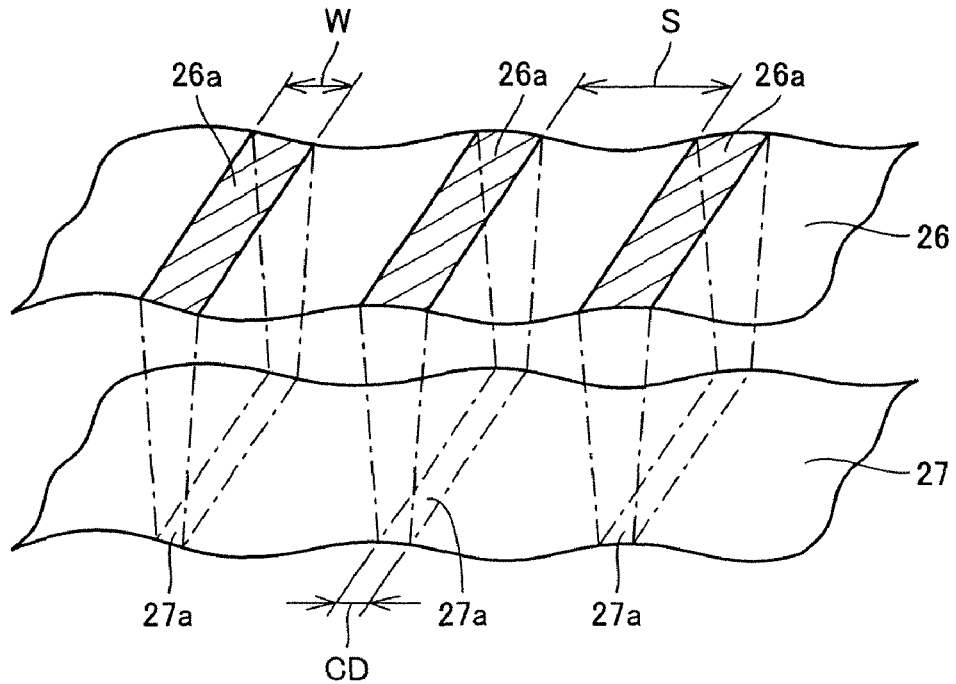
FIG. 8 is a schematic perspective view where a resist test is conducted in the first embodiment.

FIG. 8 shows a schematic perspective view of a basic pattern illustrating the dependency of Optical Proximity Effect (OPE) on a resist. In the basic pattern, an exposure is performed on a resist 27 through a half tone-type mask 26. Half tone-type mask 26 has a half tone portion 26a.

Half tone portion 26a is formed in a linear shape. Half tone portions 26a are formed such that they extend parallel to each other. An exposure region 27a of resist 27 becomes linear. In such a basic pattern, the distance between half tone portions 26a is a space size S. The width of half tone portion 26a is W. The width of exposure region 27a is CD (Critical Dimension) value. In the present embodiment, a scanner-type exposure apparatus is used where the CD value is approximately one-quarter of width W of half tone portion 26a.

Figure 9:
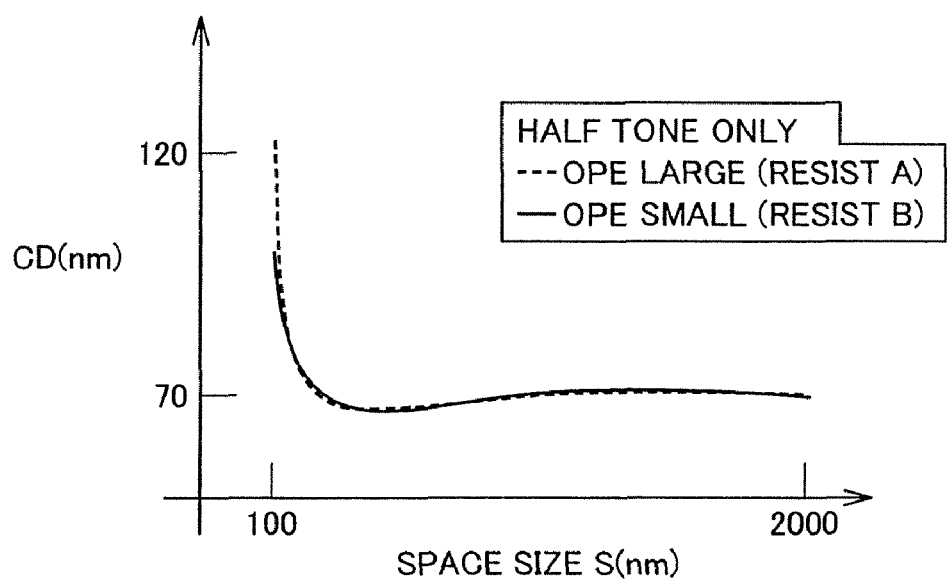
FIG. 9 is a graph showing the result of the resist test in the first embodiment.

FIG. 9 shows a graph illustrating the characteristic of CD values in two kinds of resists. In the present embodiment, an acrylic-based positive resist is used as a resist film. The axis of abscissas shows space size S and the axis of ordinates shows CD value. In the part where space size S is smaller, each of the CD values rises sharply.

Here, (the maximum value of CD value−the minimum value of CD value) in resist A is greater than (the maximum value of CD value−the minimum value of CD value) in resist B. In other words, resist A has Optical Proximity Effect greater than resist B. In this way, the OPE characteristic varies depending on the kind of resists. Therefore, a resist excellent in the OPE characteristic is preferably selected. For example, in the case of a resist with a large value of (the maximum value of CD value−the minimum value of CD value), when a pattern having a small pitch is formed, it largely deviates from the expected value. Therefore, when Optical Proximity Correction is performed, a pattern having a small pitch may attain the size below the mask manufacturing limit. In FIG. 9, it is preferable to use resist B rather than resist A.

By selecting a resist excellent in the OPE characteristic as a resist, the range of choice of the exposure amount ratio can be broadened and the exposure amount ratio can be changed without changing the expected value of the manufactured pattern.

Second Embodiment

Referring to FIG. 10 to FIG. 15, a pattern formation method in a second embodiment of the present invention will be described. The present embodiment is similar to the first embodiment in that it includes a first exposure step of performing an exposure using a Levenson-type mask and a second exposure step of performing an exposure using a half tone-type mask. In addition, similar to the first embodiment, when the second minimum dimension of the second pattern is 1.3 times or greater than the first minimum dimension of the first pattern, the exposure amount of the second exposure step is set equal to or smaller than the exposure amount of the first exposure step. In the present embodiment, in the second exposure step, an exposure is performed using a half tone-type mask having a half tone portion with reduced transmittance. In the present embodiment, a test was conducted in a manner similar to the test method in the first embodiment.

Figure 10:
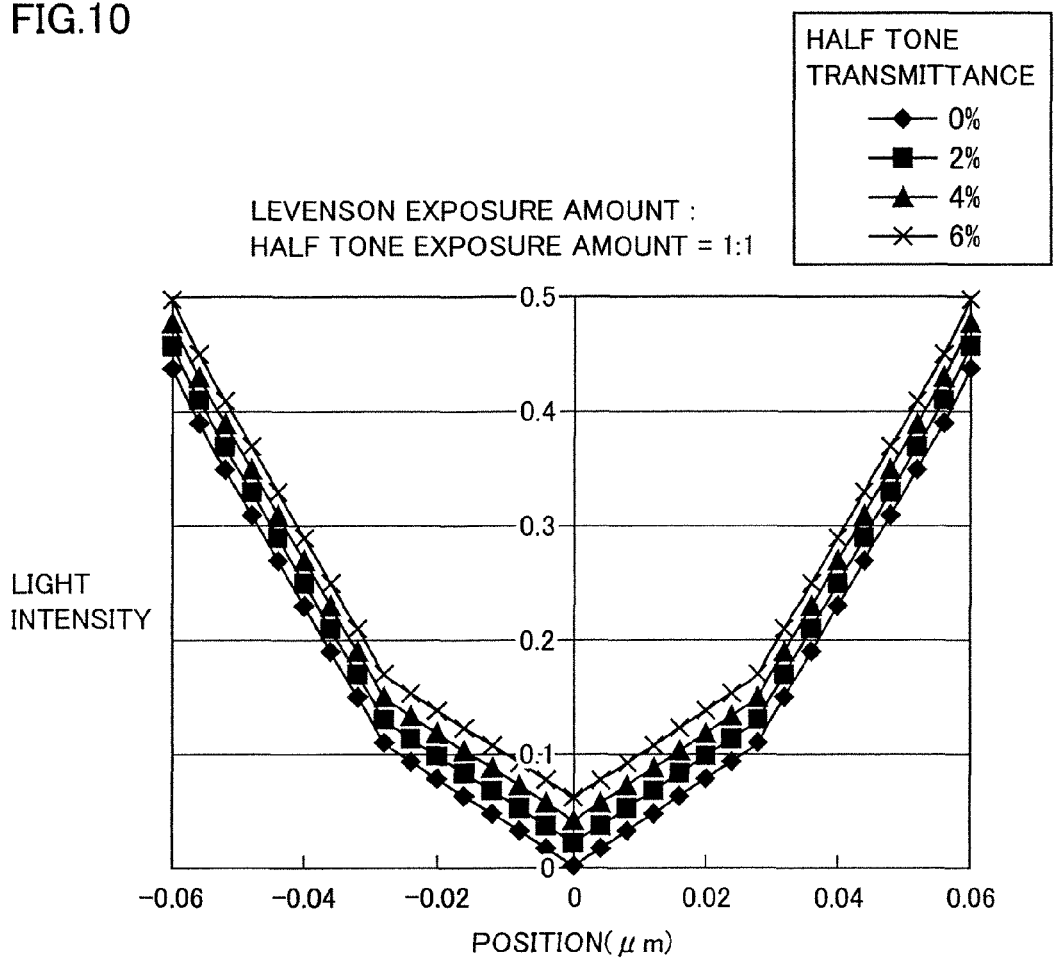
FIG. 10 is a graph of the amount of exposure illustrating the result of a first test in a second embodiment.

FIG. 10 shows a first graph illustrating the result of a first test in the present embodiment. FIG. 1 shows a second graph illustrating the result of the first test in the present embodiment. In the first test, the exposure amount of the first exposure step performed using a Levenson-type mask and the exposure amount of the second exposure step performed using a half tone-type mask were set at a ratio of 1:1. The exposure amount was found at each of the parts where the transmittance of the half tone portion of the half tone-type mask was varied from 6% to 0%.

FIG. 10 shows a graph of a composite optical image of a first pattern of the resist pattern formed by the Levenson-type mask (see FIG. 1). The axis of abscissas shows a distance from the center in the width direction of the linear part formed by the Levenson-type mask, and the axis of ordinates shows the light intensity. With the reduced transmittance of the half tone-type mask, the light intensity at the position 0 μm approaches 0.

Figure 11:
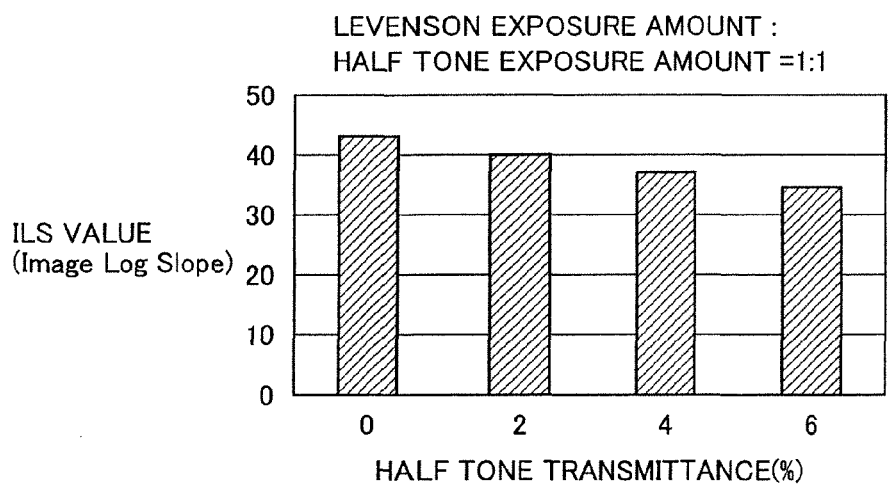
FIG. 11 is a graph of ILS value illustrating the result of the first test in the second embodiment.

FIG. 11 shows a graph of ILS value in the first test. The axis of abscissas shows the transmittance of the half tone portion of the half tone-type mask, and the axis of ordinates shows the ILS value. The mask having the transmittance of 0% at the half tone portion of the half tone-type mask serves as a normal mask blocking light which does not have a half tone portion.

As shown in FIG. 11, as the transmittance of the half tone portion is reduced, the ILS value tends to be larger. It can be understood that the dimensional accuracy of the first pattern portion improves with the reduced transmittance of the half tone portion. Referring to FIG. 11, where the ratio between the exposure amount of the Levenson-type mask and the exposure amount of the half tone-type mask is 1:1, the ILS value can be approximately 34 or more with the transmittance of 6% or less of the half tone-type mask.

Figure 12:
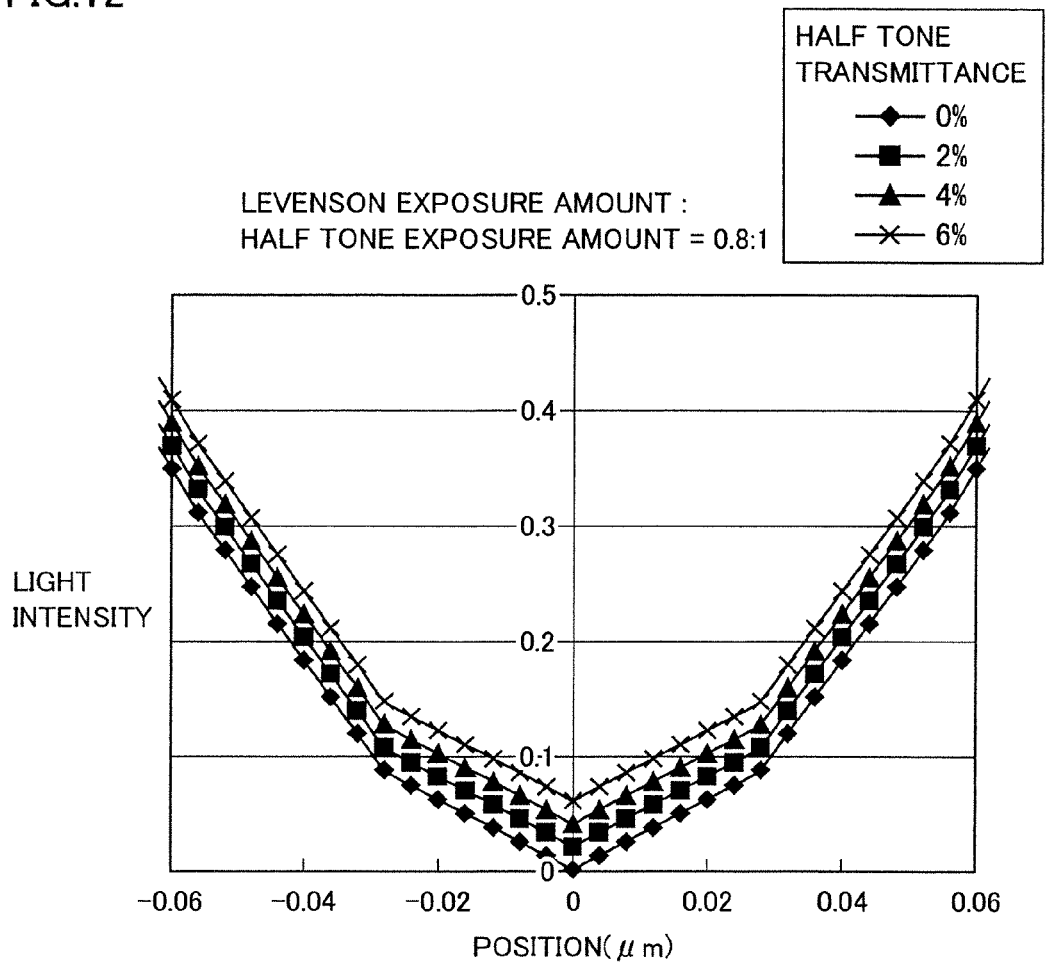
FIG. 12 is a graph of the amount of exposure illustrating the result of a second test in the second embodiment.
Figure 13:
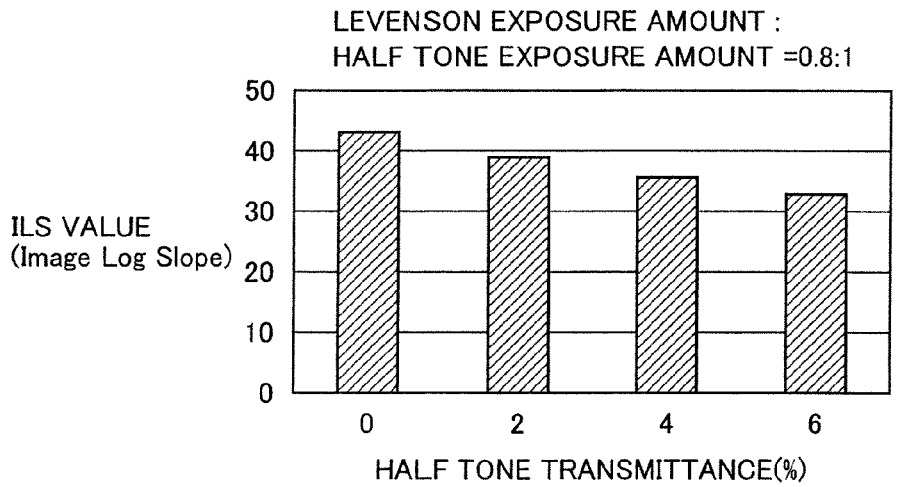
FIG. 13 is a graph of ILS value illustrating the result of the second test in the second embodiment.

FIG. 12 shows a first graph illustrating the result of a second test in the present embodiment. FIG. 13 shows a second graph illustrating the result of the second test in the present embodiment. In the second test, the exposure amount of the Levenson-type mask is set relatively smaller than the first test. In the second test, the ratio between the exposure amount of the Levenson-type mask and the exposure amount of the half tone-type mask was set at 0.8:1.

FIG. 12 shows a composite optical image of the part of the first pattern of the resist pattern formed by the Levenson-type mask. FIG. 13 shows a graph of ILS value in the second test. Referring to FIG. 12, as the transmittance of the half tone-type mask is reduced, the light intensity at position 0 μm approaches 0. Referring to FIG. 13, when the ratio between the exposure amount of the Levenson-type mask and the exposure amount of the half tone-type mask is 0.8:1, the ILS value can be approximately 34 or more with the transmittance of 4% or less of the half tone-type mask.

Figure 14:
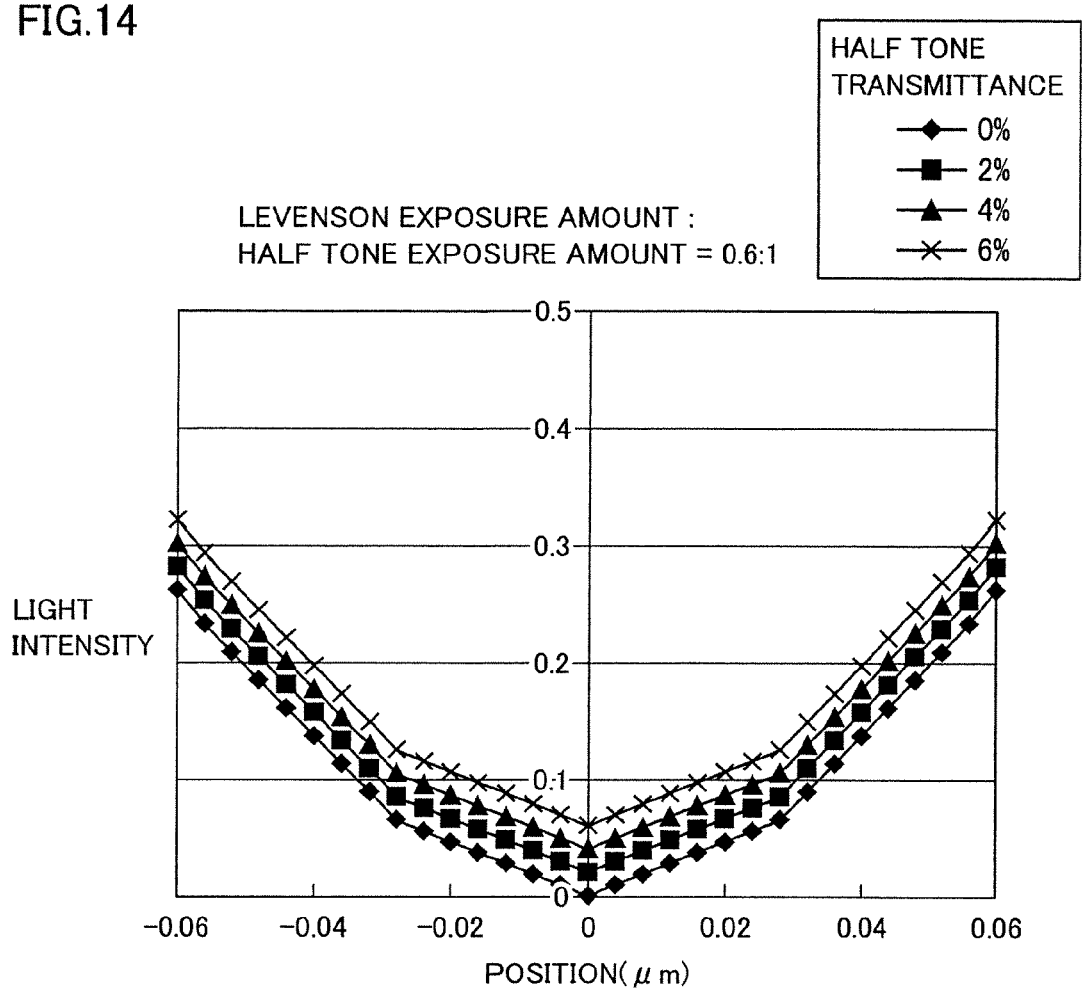
FIG. 14 is a graph of the amount of exposure illustrating the result of a third test in the second embodiment.
Figure 15:
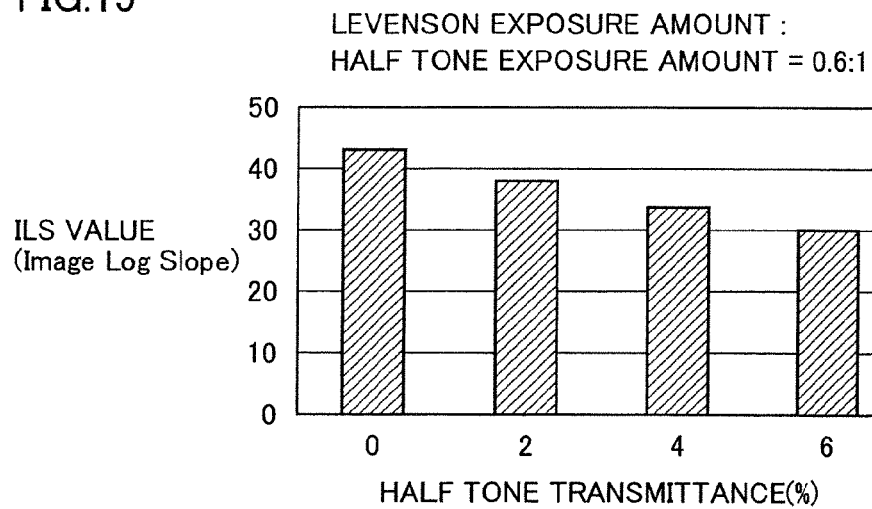
FIG. 15 is a graph of ILS value illustrating the result of the third test in the second embodiment.

FIG. 14 shows a first graph illustrating the result of a third test in the present embodiment. FIG. 15 shows a second graph illustrating the result of the third test in the present embodiment. In the third test, the exposure amount of the Levenson-type mask is further reduced relatively to the second test. In the third test, the ratio between the exposure amount of the Levenson-type mask and the exposure amount of the half tone-type mask was set at 0.6:1.

FIG. 14 shows a graph of the composite optical image of the part of the first pattern of the resist pattern formed by the Levenson-type mask. FIG. 15 shows a graph of ILS value in the third test. Referring to FIG. 14, the light intensity at the position 0 μm approaches 0 by reducing the transmittance of the half tone portion of the half tone-type mask. Referring to FIG. 15, when the ratio between the exposure amount of the Levenson-type mask and the exposure amount of the half tone-type mask is 0.6:1, the ILS value can be approximately 34 or more with the transmittance of 4% or less of the half tone-type mask.

In this manner, even if the ratio between the exposure amount of the Levenson-type mask and the exposure amount of the half tone-type mask is varied, the transmittance of the half tone portion of the half tone-type mask is adjusted correspondingly, so that the dimensional accuracy of a pattern formed by the Levenson-type mask can be improved.

The other configuration, action, effect, and method are similar to those of the first embodiment and therefore the description will not be repeated here.

Third Embodiment

Referring to FIG. 16 to FIG. 20, a pattern formation method in a third embodiment of the present invention will be described. The pattern formation method in the present embodiment is similar to the first embodiment in that it includes a first exposure step of performing an exposure using a Levenson-type mask and a second exposure step of performing an exposure using a half tone-type mask. In the present embodiment, when the second minimum dimension of the second pattern is 1.0 time or greater and 1.1 times or smaller than the first minimum dimension of the first pattern, the exposure amount of the second exposure step is set to be greater than the exposure amount of the first exposure step.

Figure 16:
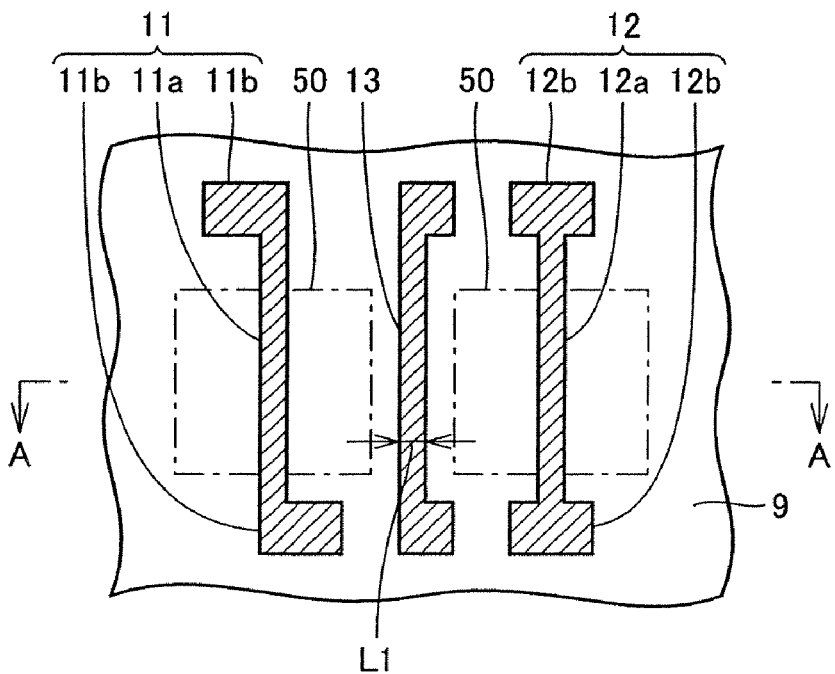
FIG. 16 is a schematic plan view of a resist pattern formed in a third embodiment.

FIG. 16 is a schematic plan view of a resist pattern in the third embodiment. Resist patterns 11-13 are formed at a surface of substrate 9. Resist pattern 13 is arranged at a position where it is sandwiched between resist pattern 11 and resist pattern 12. Resist pattern 13 is formed by the half tone-type mask.

Resist pattern 11 includes a first pattern portion 11*a* and a second pattern portion 11*b*. Resist pattern 12 includes a first pattern portion 12*a* and a second pattern portion 12*b*. First pattern portions 11*a*, 12*a* are formed by the Levenson-type mask. Second resist patterns 11*b*, 12*b* are formed by the half tone-type mask.

First pattern portion 11*a*, 12*a* serves, for example, as a gate electrode of a field effect transistor. An active region 50 is a region formed by implanting an impurity in a surface of substrate 9 to serve, for example, as a source region or a drain region of a field effect transistor. The part of resist pattern 13 has, for example, an interconnection formed therein.

In the present embodiment, attention will be paid to resist pattern 13 sandwiched between the resist patterns formed by the Levenson-type mask. The interconnection pattern at the surface of substrate 9 which is formed by resist pattern 13 has a width of 70 nm at the linear part (the width of the part corresponding to width L1 of resist pattern 13 in FIG. 16).

Figure 17:
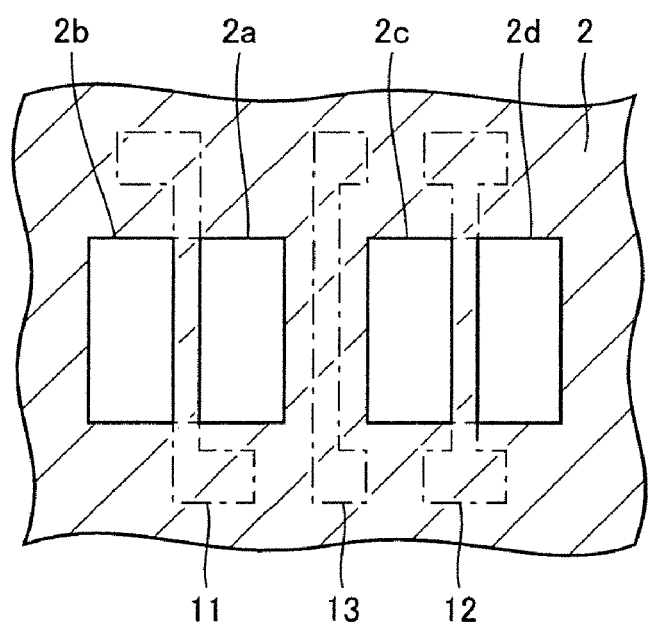
FIG. 17 is a schematic plan view of a Levenson-type mask in the third embodiment.

FIG. 17 shows a schematic plan view of the Levenson-type mask in the present embodiment. The Levenson-type mask includes a light shielding film 2. Light shielding film 2 has same phase opening portions 2a, 2c and reverse phase opening portions 2b, 2d. Same phase opening portion 2a and reverse phase opening portion 2b are paired so that first pattern portion 11a of resist pattern 11 is formed as a line pattern between same phase opening portion 2a and reverse phase opening portion 2b. Similarly, same phase opening portion 2c and reverse phase opening portion 2d are paired so that first pattern portion 12a of resist pattern 12 is formed (see FIG. 16).

Figure 18:
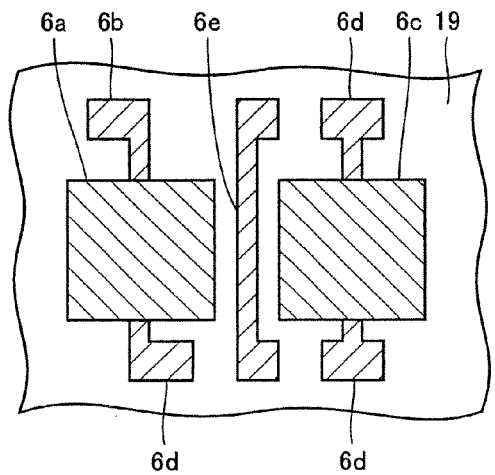
FIG. 18 is a schematic plan view of a half tone-type mask in the third embodiment.

FIG. 18 shows a schematic plan view of the half tone-type mask in the present embodiment. The half tone-type mask includes transparent substrate 19. Light shielding portions 6a, 6c are formed on a surface of transparent substrate 19. Light shielding portions 6a, 6c are formed to allow light to slightly pass through. Half tone portions 6b, 6d, 6e are formed on a surface of transparent substrate 19. Light shielding portions 6a, 6c are formed corresponding to the opening portions of the Levenson-type mask. Half tone portions 6b, 6d are formed corresponding to second pattern portions 11b, 12b of resist patterns 11, 12, respectively. Half tone portion 6e is formed corresponding to resist pattern 13 (see FIG. 16). In this way, the linear portion of resist pattern 13 subjected to exposure using the half tone-type mask is sandwiched between first pattern portions 11a, 12a of resist patterns 11, 12 subjected to exposure using the Levenson-type mask.

When exposures are performed using these Levenson-type mask and half tone-type mask at the ratio of exposure amount of 1:1, for example, the light shielding portion width of the interconnection pattern arranged between the opening portions of the Levenson-type mask and formed by the half tone-type mask is 90 nm, which corresponds to length L1 in the width direction of resist pattern 13 (see FIG. 16).

Figure 19:
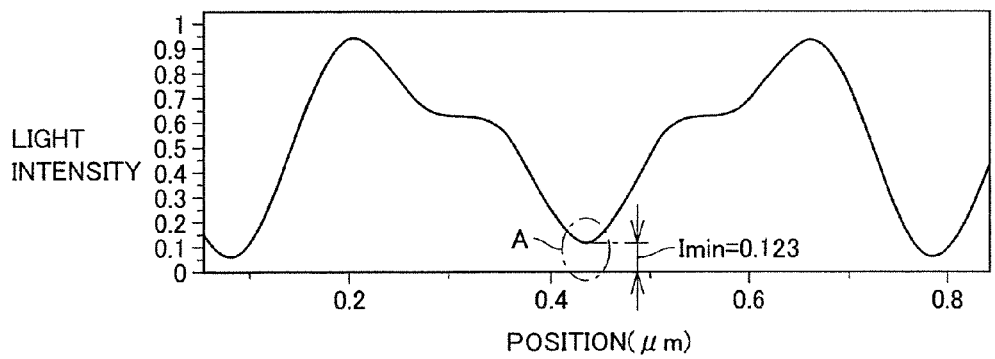
FIG. 19 is a graph of the amount of exposure illustrating the result of a first test in the third embodiment.

FIG. 19 shows a graph of a composite optical image where the exposure amount ratio between the Levenson-type mask and the half tone-type mask is 1:1. The axis of abscissas shows a position in cross section taken along line A-A in FIG. 16. The axis of ordinates shows the light intensity of the composite optical image. In FIG. 19, the part A corresponds to the part of resist pattern 13 in FIG. 16. The minimum value Imin of the light intensity is 0.123.

Now, the exposure where the exposure amount ratio between the Levenson-type mask and the half tone-type mask is 0.6:1 will be described. In other words, the exposure amount of the Levenson-type mask is relatively reduced. In this case, the light shielding portion width of the interconnection pattern arranged between the opening portions of the Levenson-type mask and formed by the half tone-type mask is 110 nm, which corresponds to the length L1 in the width direction of resist pattern 13 (see FIG. 16).

Figure 20:
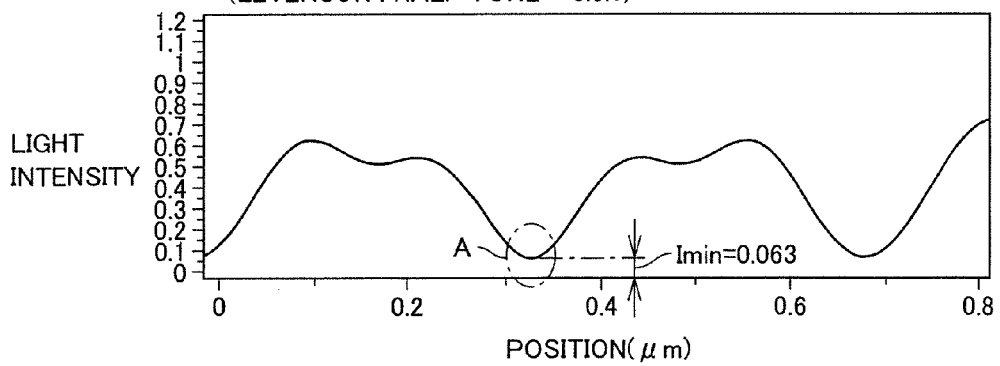
FIG. 20 is a graph of the amount of exposure illustrating the result of a second test in the third embodiment.

FIG. 20 shows a graph of a composite optical image where the exposure amount ratio between the Levenson-type mask and the half tone-type mask is 0.6:1. The part A corresponds to the part of resist pattern 13 in FIG. 16. A small value can be achieved as the minimum value Imin of the light intensity is 0.063.

Referring to FIG. 19 and FIG. 20, when the ratio of the exposure amount of the Levenson-type mask to the exposure amount of the half tone-type mask is increased, the minimum value Imin of the light intensity of the pattern formed by the half tone-type mask may not be reduced enough. The first exposure step using the Levenson-type mask has an effect on a latent image to be formed by the half tone-type mask, so that the minimum value Imin of the light intensity of the line pattern to be formed by the half tone-type mask is increased.

As a result, for example, a defect such as a disconnection may take place at the part formed by the half tone-type mask. More specifically, in the exposure process in the first exposure step, the exposure amount and focus are set as the optimum conditions, and this focus (focusing) may sometimes vary under some influence given by the apparatus so that exposure may be performed in the varied state. Here, the latent image formed by the phase shift-type mask influences the latent image formed by the half tone-type mask, which may cause a defect in the pattern formed by the half tone-type mask.

This defect appears conspicuously in the step of forming a first pattern having a first minimum dimension and forming a second pattern having a second minimum dimension where the second minimum dimension is 1.1 times or less than the first minimum dimension. In this case, the exposure amount of the second exposure step with the half tone-type mask is set to be greater than the exposure amount of the first exposure step with the Levenson-type mask. This method can suppress a defect in that pattern of the second patterns formed by the half tone-type mask which is adjacent to the first pattern formed by the Levenson-type mask. Specifically, a defect of the second pattern sandwiched between the first patterns can be suppressed.

For example, in FIG. 16, a disconnection at the linear part of resist pattern 13 sandwiched between first pattern portions 11a, 12a of resist patterns 11, 12 can be suppressed.

In the present embodiment, the contrast of a latent image formed by the half tone-type mask can be improved, and a defect of a pattern formed by the half tone-type mask can be suppressed. In other words, in the second exposure step using the half tone-type mask, the focus tolerance in exposure can be improved.

Now, the manner of use of the pattern formation method described in the present embodiment and the pattern formation methods described in the first and second embodiments will be described.

A semiconductor device A and a semiconductor device B are formed which are designed with a minimum gate length of 70 nm of the gate lengths of field effect transistors. The gate electrode of the field effect transistor is formed by the Levenson-type mask and the interconnection portion is formed by the half tone-type mask.

Here, as for semiconductor device A, the minimum dimension of the interconnection portion is set at 100 nm. The interconnection portion of semiconductor device A is arranged such that the process margin in forming a latent image in exposure is larger. The dimensional accuracy required of the gate length of semiconductor device A is under strict conditions. On the other hand, as for semiconductor device B, the minimum dimension of the interconnection portion is set at 70 nm, which is equal to the minimum dimension of the gate length. The interconnection portion of semiconductor device B has a small process margin of forming a latent image in exposure. However, the dimension described above may vary ±10% or so in the finishing state due to variations in manufacturing processes.

In such a case, as for semiconductor device A, as shown in the first embodiment, the exposure amount with the half tone-type mask is set to be equal to or be smaller than the exposure amount with the Levenson-type mask, resulting in a gate electrode having high dimensional accuracy within the range of the process margin of forming a latent image of an interconnection portion.

As for semiconductor device B, as shown in the present embodiment, the exposure amount with the half tone-type mask is set to be greater than the exposure amount with the Levenson-type mask, thereby ensuring a process margin of forming a latent image in forming an interconnection portion.

The other configuration, action, effect, and method are similar to those of the first and second embodiments and therefore the description will not be repeated here.

Fourth Embodiment

Referring to FIG. 21 to FIG. 26, a method of manufacturing a Levenson-type mask in a fourth embodiment of the present invention will be described.

Figure 21:
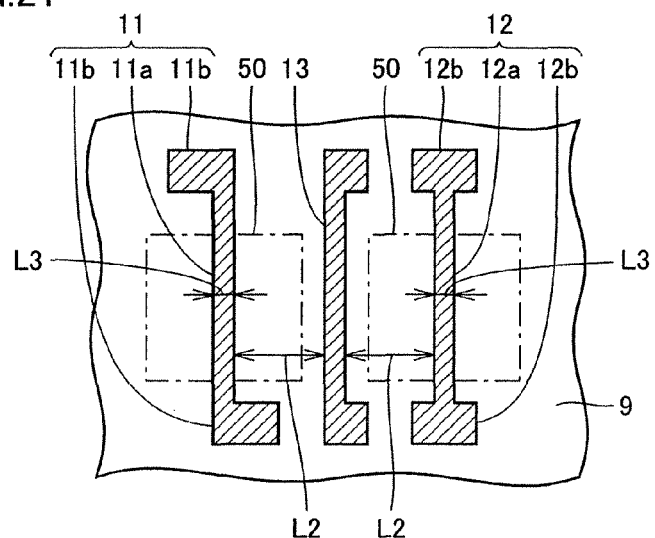
FIG. 21 is a schematic plan view of a resist pattern formed in a fourth embodiment.

FIG. 21 shows a schematic plan view of a resist pattern formed in the present embodiment. In the present embodiment, a Levenson-type mask and a half tone-type mask are used. Resist patterns 11-13 are formed on a surface of substrate 9 with a conductive film (not shown) such as polysilicon interposed therebetween. Resist pattern 11 includes first pattern portion 11a and second pattern portion 11b. Resist pattern 12 includes first pattern portion 12a and second pattern portion 12b.

First pattern portions 11a, 12a are formed using the Levenson-type mask. Furthermore, using first pattern portions 11a, 12a as a mask, the conductive film is patterned, resulting in, for example, the gate electrode of a field effect transistor. Active region 50 serves as a source region or a drain region of a field effect transistor. Second pattern portions 11b, 12b are formed using the half tone-type mask. Resist pattern 13 is formed using the half tone-type mask. Resist pattern 13 forms, for example, an interconnection.

In the present embodiment, the distance corresponding to distance L2 between first pattern portion 11a and the linear portion of resist pattern 13 is 160 nm. For example, the distance between the gate electrode of a field effect transistor and an interconnection is 160 nm. In the present embodiment, the distance between first pattern portion 12a and the linear portion of resist pattern 13 is equal to the distance between first pattern portion 11a and the linear portion of resist pattern 13.

In the present embodiment, the width of a line formed corresponding to width L3 of first pattern portion 11a, 12a is 60 nm. The width of a line formed corresponding to the width of the linear portion of resist pattern 13 is equal to the width corresponding to width L3. For example, the width of the gate electrode of a field effect transistor is 60 nm.

Figure 22:
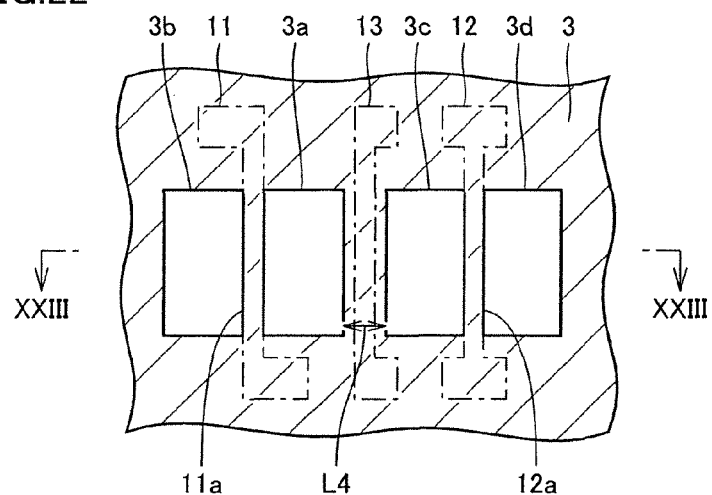
FIG. 22 is a schematic plan view of a Levenson-type mask in the fourth embodiment.
Figure 23:
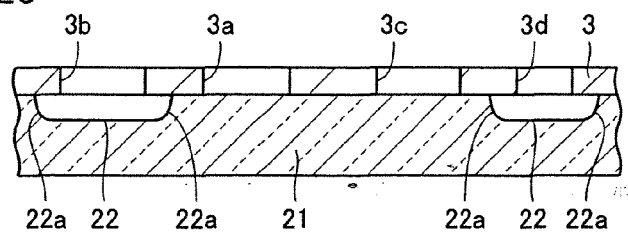
FIG. 23 is a schematic cross sectional view of the Levenson-type mask in the fourth embodiment.

FIG. 22 shows a schematic plan view of the Levenson-type mask in the present embodiment. FIG. 23 shows a cross sectional view taken along line XXIII-XXIII as viewed from the arrow in FIG. 22.

The Levenson-type mask in the present embodiment includes a light shielding film 3 on a transparent substrate 21. Light shielding film 3 is formed to block light. Light shielding film 3 has same phase opening portions 3a, 3c and reverse phase opening portions 3b, 3d. In the present embodiment, same phase opening portions 3a, 3c are formed adjacent to each other.

Referring to FIG. 23, light shielding film 3 is formed on the surface of transparent substrate 21. The main surface of transparent substrate 21 is located in same phase opening portions 3a, 3c. A concave portion 22 is formed at each of reverse phase opening portions 3b, 3d in the surface of transparent substrate 21. Concave portion 22 is formed such that the phase of light passing through reverse phase opening portions 3b, 3d is shifted by half-wavelength. In other words, it is formed such that the phase is reversed. Concave portion 22 has an undercut portion 22a.

In the Levenson-type mask, a same phase opening portion and a reverse phase opening portion have to be arranged on opposite sides of a pattern such as a line pattern to be formed. In other words, a pattern to be formed has to be sandwiched between a same phase opening portion and a reverse phase opening portion.

In the step of manufacturing a Levenson-type mask, an opening portion has to be set for a pattern to be formed. The method of manufacturing a Levenson-type mask includes an opening portion setting step of setting a same phase opening portion and a reverse phase opening portion. One same phase opening portion and one reverse phase opening portion are set in pair, so that one pattern is formed in the subsequent exposure. A concave portion is formed in the surface of the substrate corresponding to the set reverse phase opening portion. The present embodiment includes a step of setting a same phase opening portion in at least one of the opening portions that form pairs opposed to each other, of the pairs of same phase opening portions and reverse phase opening portions, in the order of increasing distance between the pairs.

Referring to FIG. 22, opening portions are formed on opposite sides of the part corresponding to each of resist pattern 11 and resist pattern 12. Here, with reference to distance L4 between the opening portions that form pairs opposed to each other, it is assumed that the distance between the pairs is shorter than the other portions. In this case, a same phase opening portion is set in at least one of them. In the present embodiment, same phase opening portions 3a, 3c are formed in both of the opening portions that form pairs opposed to each other.

The configuration of the half tone-type mask in the present embodiment is similar to that of the half tone-type mask in the third embodiment (see FIG. 18).

Figure 24:
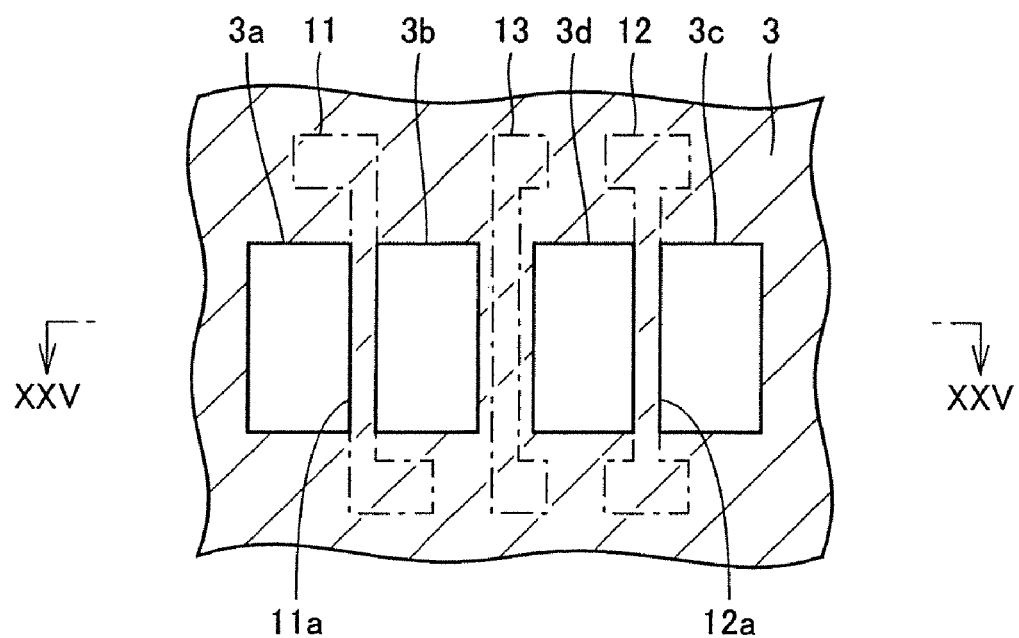
FIG. 24 is a schematic plan view of a Levenson-type mask in a comparative example in the fourth embodiment.
Figure 25:
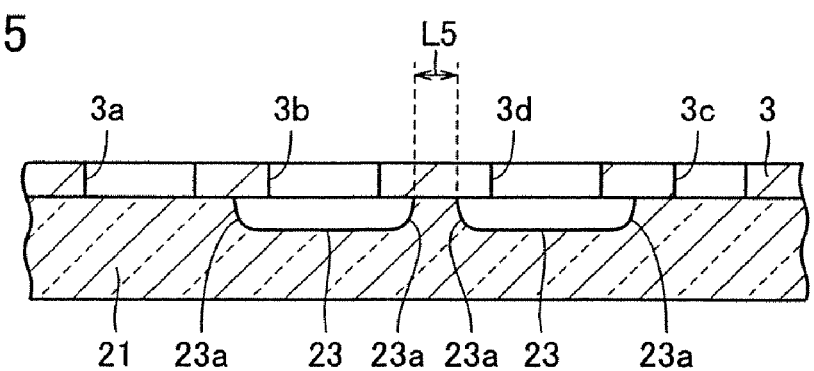
FIG. 25 is a schematic cross sectional view of the Levenson-type mask in the comparative example in the fourth embodiment.

FIG. 24 shows a schematic plan view of a Levenson-type mask as a comparative example in the present embodiment. FIG. 25 shows a cross sectional view taken along line XXV-XXV as viewed from the arrow in FIG. 24.

Referring to FIG. 24, the Levenson-type mask as a comparative example is different in a method of setting a same phase opening portion and a reverse phase opening portion in the opening portions. Same phase opening portion 3a and reverse phase opening portion 3b are paired. In addition, same phase opening portion 3c and reverse phase opening portion 3d are paired. In the Levenson-type mask as a comparative example, the opening portions that form two pairs opposed to each other are set as reversal opening portions 3b, 3d. The opening portions corresponding to the opposite sides of resist pattern 13 are set as reverse phase opening portions 3b, 3d.

Referring to FIG. 25, the main surface of transparent substrate 21 is formed in same phase opening portions 3a, 3c. A concave portion 23 is formed at each of reverse phase opening portions 3b, 3d in the main surface of transparent substrate 21. Concave portion 23 has an undercut portion 23a.

In the step of manufacturing a Levenson-type mask, for example, a light shielding film having an opening portion is formed on the surface of a transparent substrate. Then, dry etching is performed to form a portion which is concave from the main surface of the transparent substrate. Then, wet etching is additionally performed to form an undercut portion below the opening portion of the light shielding film.

For example, in the comparative example, undercut portion 23a of 100 nm is formed farther from the edge of each of reverse phase opening portions 3b, 3d. The distance between reverse phase opening portion 3b and reverse phase opening portion 3d is 400 nm. In this case, the contact width L5 between light shielding film 3 and transparent substrate 21 is 200 nm. In this way, when the ratio between contact width L5 and the distance between reverse phase opening portion 3b and reverse phase opening portion 3d is ½ or less, the undercut portions opposed to each other reduce the contact area between light shielding film 3 and transparent substrate 21, which may cause the light shielding film to be partially stripped off. Specifically, when the distance between opening portions is reduced with further miniaturization of line patterns, the inconvenience of partial stripping of the light shielding film is remarkable.

In the opening portion setting step of setting an opening portion, a same phase opening portion is set in at least one of the opening portions that form pairs opposed to each other, in the order of increasing distance between the pairs of same phase opening portions and reverse phase opening portions, whereby stripping of the light shielding film can be prevented at the part where the pairs are opposed to each other. In the present embodiment, the same phase opening portions are set in the opening portions on both sides of the pairs opposed to each other. Referring to FIG. 23 and FIG. 24, same phase opening portion 3a and same phase opening portion 3c are set which are opposed to each other. Therefore, the contact area between transparent substrate 21 and that part of light shielding film 3 which is sandwiched between same phase opening portion 3a and same phase opening portion 3c can be increased, thereby preventing the stripping of light shielding film 3.

The method of setting a same phase opening portion and a reverse phase opening portion in the region of the opening portions of the Levenson-type mask may employ, for example, shifter arrangement DA (Design Automation) system. By applying the opening portion setting method of the present invention to the shifter arrangement DA, the kind of opening portions of the Levenson-type mask can be set.

Figure 26:
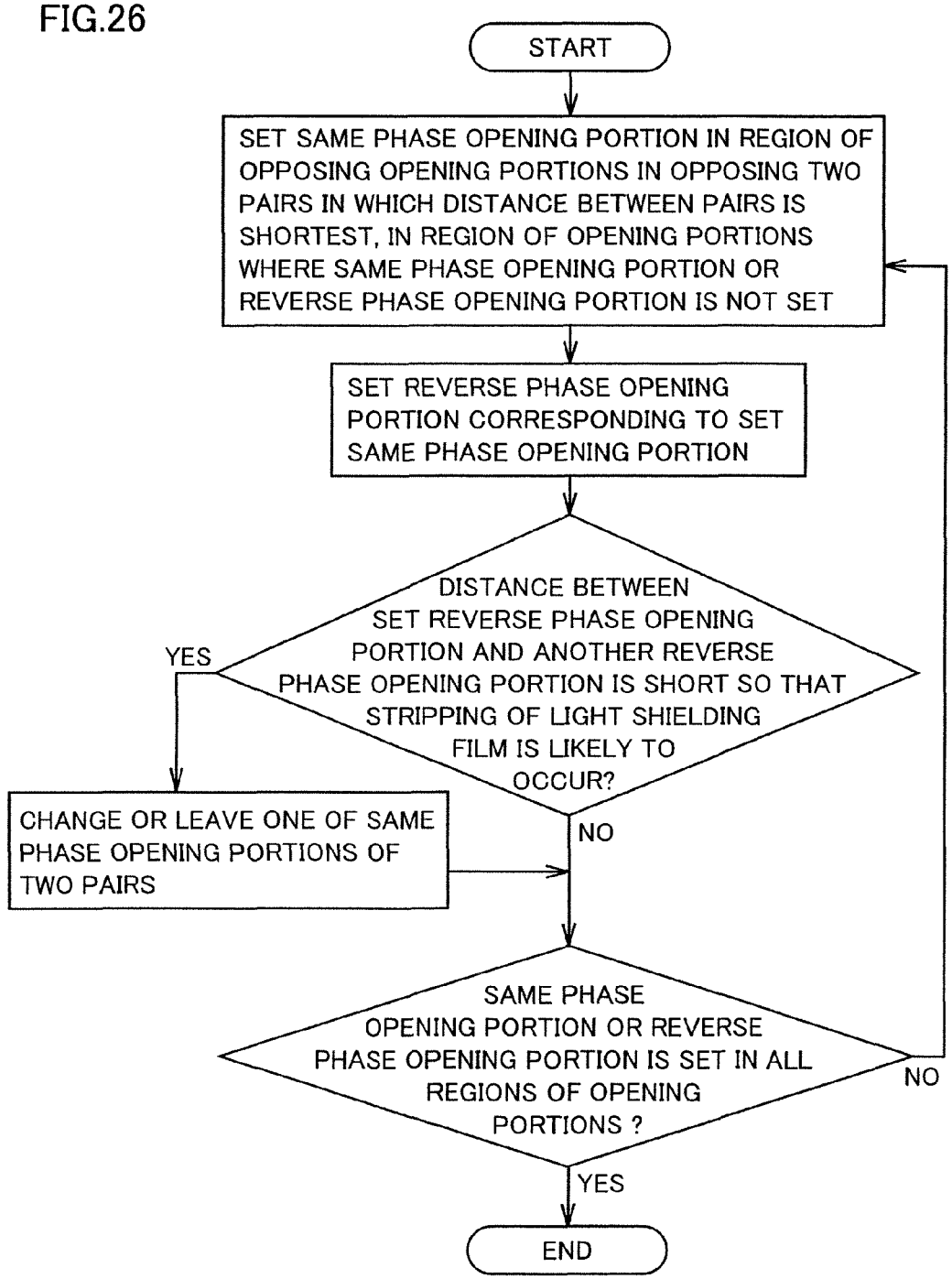
FIG. 26 is an illustration of a method of setting a same phase opening potion and a reverse phase opening portion in a region of opening portions of the Levenson-type mask in the fourth embodiment.

FIG. 26 shows an exemplary opening portion setting method in the present embodiment. A region of opening portions through which light passes is set beforehand for a resist pattern to be formed, and a same phase opening portion or a reverse phase opening portion is then set in each region of opening portions.

First, assuming that a same phase opening portion and a reverse phase opening portion are paired, a part where the distance between the pairs is shortest is selected. In this part, a same phase opening portion is set in the region of two opening portions opposed to each other, of the region of four opening portions included in the opposing two pairs. Then, a pair of reverse phase opening portions corresponding to the set same phase opening portions is set.

Then, it is determined whether or not the distance between the set reverse phase opening portion and another reverse phase opening portion is short so that the stripping of the light shielding film is likely to occur. If the stripping of the light shielding film is likely to occur, one of the set two same phase opening portions is changed to a reverse phase opening portion so that the opening portions in a pair are changed to same phase opening portions. In other words, if the distance between the set reverse phase opening portion and another reverse phase opening portion is too short, the above-noted change is reset and the process proceeds to the next step.

Then, in the region of opening portions where a same phase opening portion and a reverse phase opening portion are not set, the similar operation is repeated. In this manner, a same phase opening portion and a reverse phase opening portion are set for all the regions of opening portions.

In the example shown in FIG. 26, a same phase opening portion is set in the order of increasing distance between the pairs. However, the present invention is not limited to this manner. Those parts where the distance between the pairs is equal to or less than a prescribed value are selected, and among the selected parts, a part where a pattern formed by the half tone-type mask is present between pairs may be given priority to set a same phase opening portion.

Furthermore, a shifter may be arranged at the main surface of the transparent substrate in addition to the concave portion formed in the surface of the transparent substrate. Therefore, a manufacturing error may be caused in the formation of the concave portion or the arrangement of the shifter. In other words, a phase difference may be shifted due to the manufacturing error of the Levenson-type mask. Thus, the pattern formed at a part sandwiched between reverse phase opening portions may be influenced by the shifted phase difference, possibly resulting in deteriorated dimensional accuracy.

However, as in the present embodiment, at least one of the patterns formed by the half tone-type mask is set as a same phase opening portion in the order of increasing distance between the pairs, thereby preventing exposure with a shifted phase resulting from the manufacturing error in manufacturing these masks, and improving dimensional accuracy.

The other configuration, action, effect, and method are similar to those of the first to third embodiments and therefore the description will not be repeated here.

Fifth Embodiment

Referring to FIG. 27 to FIG. 30, a pattern formation method and a method of manufacturing a Levenson-type mask in a fifth embodiment of the present invention will be described.

Figure 27:
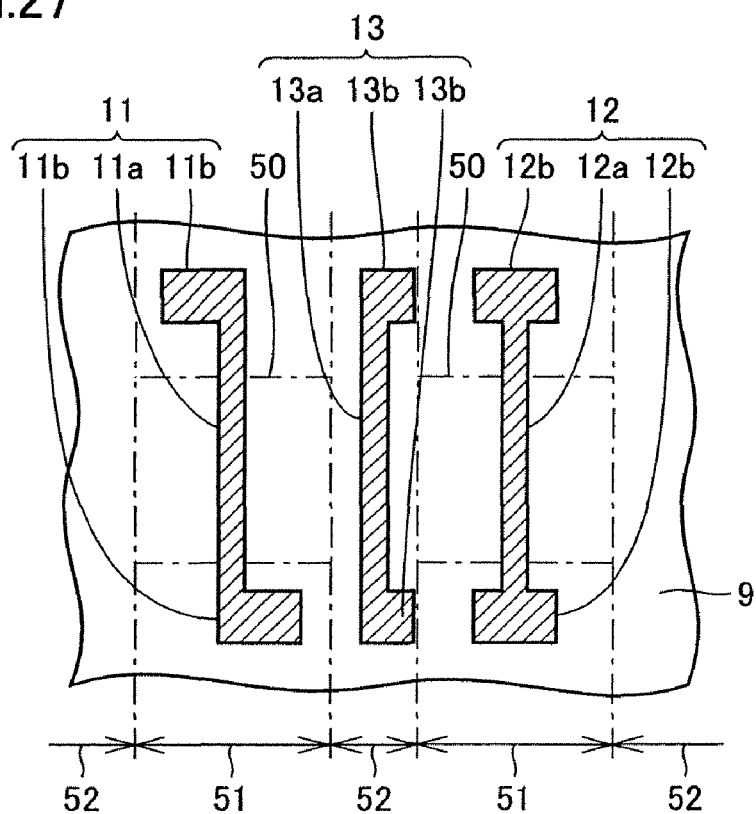
FIG. 27 is a schematic plan view of a resist pattern formed in a fifth embodiment.

FIG. 27 is a schematic plan view of a resist pattern formed by a Levenson-type mask in the present embodiment. Resist patterns 11-13 are formed on a surface of substrate 9. Resist pattern 13 is formed between resist pattern 11 and resist pattern 12. First pattern portion 11a of resist pattern 11 and first pattern portion 12a of resist pattern 12 are formed by the Levenson-type mask.

Resist pattern 13 includes a first pattern portion 13a and a second pattern portion 13b. In the present embodiment, first pattern portion 13a is formed by the Levenson-type mask. Second pattern portion 13b is formed by the half tone-type mask.

In the present embodiment, first pattern portions 11a, 12a of resist patterns 11, 12 formed on a conductive film (not shown) such as polysilicon are used to form the gate electrode of a field effect transistor, and resist pattern 13 is used to form an interconnection. Active region 50 is formed on opposite sides of first pattern portions 11a, 12a, where the source region of a field effect transistor and the like is formed. Resist patterns 11, 12 each are formed in an element region 51 in which an element is formed. An element isolation region 52 is a region where an element such as a field effect transistor is not formed. Resist pattern 13 is formed in element isolation region 52.

Figure 28:
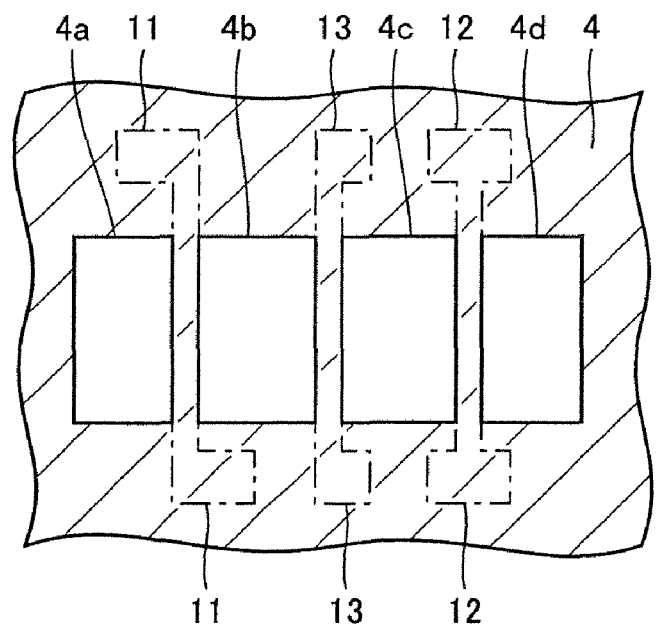
FIG. 28 is a schematic plan view of a Levenson-type mask in the fifth embodiment.

FIG. 28 shows a schematic plan view of the Levenson-type mask in the present embodiment. In the Levenson-type mask in the present embodiment, a same phase opening portion 4a and a reverse phase opening portion 4b are formed in a light shielding film 4 to form first pattern portion 11a of resist pattern 11. A same phase opening portion 4c and a reverse phase opening portion 4d are also formed to form a resist pattern 12.

In the present embodiment, the linear first pattern portion 13b of resist pattern 13 is also formed by the Levenson-type mask. Here, resist pattern 13 sandwiched between resist pattern 11 and resist pattern 12 is a part that is conventionally formed by the half tone-type mask. In the present embodiment, the size of reverse phase opening portion 4b and same phase opening portion 4c arranged at the position where resist pattern 13 is sandwiched therebetween is enlarged. First pattern portion 13a of resist pattern 13 is formed by the light passing through reverse phase opening portion 4b and the light passing through same phase opening portion 4c (see FIG. 27).

Figure 29:
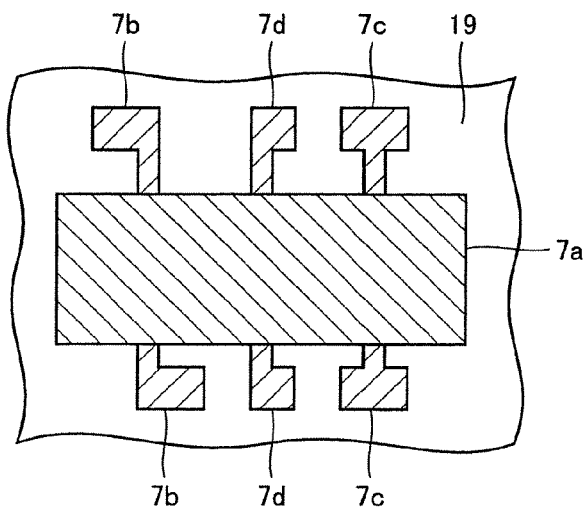
FIG. 29 is a schematic plan view of a half tone-type mask in the fifth embodiment.

FIG. 29 shows a schematic plan view of the half tone-type mask in the present embodiment. A light shielding portion 7a is formed at the surface of transparent substrate 19. Light shielding portion 7a is formed to cover first pattern portion 11a of resist pattern 11, first pattern portion 12a of resist pattern 12 and first pattern portion 13a of resist pattern 13 (see FIG. 27). Light shielding portion 7a is formed corresponding to opening portions 4a-4d of the Levenson-type mask (see FIG. 28).

Half tone portions 7b, 7c are formed corresponding to second pattern portions 11b, 12b of resist patterns 11, 12. Half tone portion 7d is formed corresponding to second pattern portion 13b of resist pattern 13 (see FIG. 27).

Referring to FIG. 27, when the distance between resist pattern 13 formed in element isolation region 52 and the exposure region of the Levenson-type mask falls within a prescribed distance, if the entire resist pattern 13 is formed by exposure using the half tone-type mask, the exposure light passing through reverse phase opening portion 4b and same phase opening portion 4c has the greater effect on first pattern portion 13a of resist pattern 13. As a result, the dimensions of first pattern portion 13a of resist pattern 13 may vary widely.

If within the above-noted prescribed distance, the size of the same phase opening portion and the reverse phase opening portion arranged on the outer side of the interconnection pattern to be formed by the half tone-type mask is enlarged so that the interconnection pattern is formed by the Levenson-type mask.

The method of manufacturing a semiconductor device in the present embodiment includes the step of forming the second pattern portion by the Levenson-type mask when the distance between the second pattern to be formed by the half tone-type mask and the region exposed through the opening portion of the Levenson-type mask is such a distance that has a substantial effect on the dimensional variations of the second pattern.

In other words, in the present embodiment, even for the pattern other than a minute pattern or a pattern requiring dimensional accuracy which is to be formed by the Levenson-type mask, if the distance from the pattern to be formed by the Levenson-type mask is within a prescribed distance, that pattern is formed by exposure using the Levenson-type mask.

Figure 30:
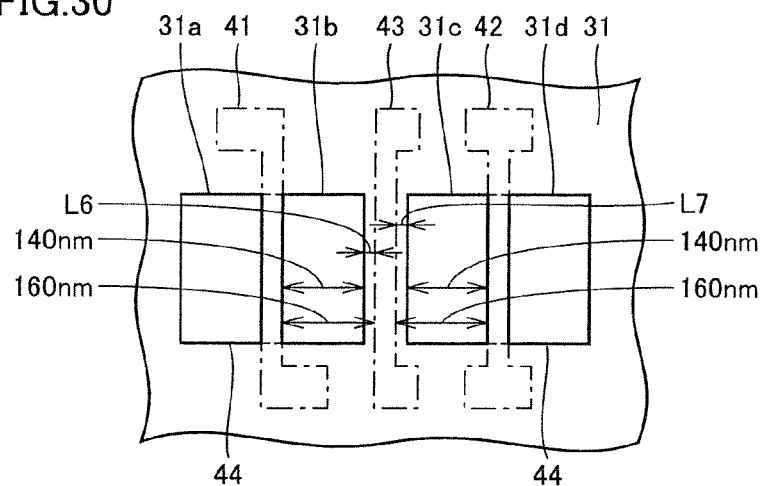
FIG. 30 is a first step illustration where a same phase opening portion and reverse phase opening portion are set in a region of opening portions of the Levenson-type mask in the fifth embodiment.
Figure 31:
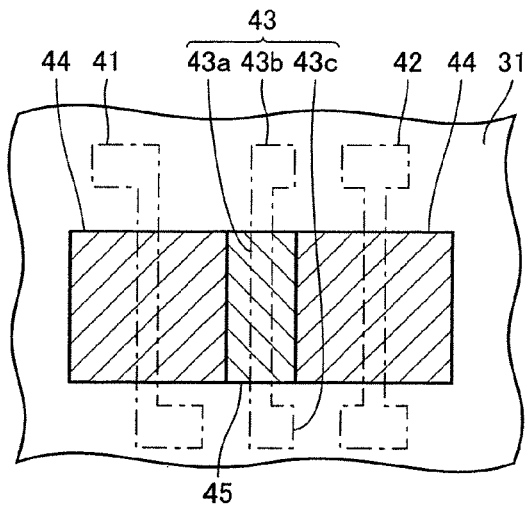
FIG. 31 is a second step illustration where a same phase opening portion and reverse phase opening portion are set in a region of opening portions of the Levenson-type mask in the fifth embodiment.

FIG. 30 and FIG. 31 show schematic plan views illustrating the opening portion setting step of setting an opening portion in the method of manufacturing a Levenson-type mask in the present embodiment. In the present embodiment, an opening portion of the Levenson-type mask corresponding to a resist pattern to be formed is set by a calculator. The calculator includes a program for setting an opening portion of the Levenson-type mask.

FIG. 30 is an illustration of a corresponding part in the calculator. Resist pattern corresponding portions 41-43 are set for a mask corresponding portion 31. Here, resist pattern corresponding portions 41, 42 correspond to resist patterns 11, 12 in FIG. 27. Resist pattern corresponding portion 43 corresponds to resist pattern 13 in FIG. 27.

Then, an active region corresponding portion 44 is set around each of resist pattern corresponding portions 41, 42. Active region corresponding portion 44 corresponds to active region 50 in FIG. 27.

Then, a same phase opening portion 31a and a reverse phase opening portion 31b are set on opposite sides of resist pattern corresponding portion 41. A same phase opening portion 31c and a reverse phase opening portion 31d are also set on opposite sides of resist pattern corresponding portion 42.

Resist pattern corresponding portion 43 is sandwiched between reverse phase opening portion 31b and same phase opening portion 31c. Here, it is assumed that at least one of distance L6 between resist pattern corresponding portion 43 and reverse phase opening portion 31b and distance L7 between resist pattern corresponding portion 43 and same phase opening portion 31c is within a prescribed distance. In other words, it is assumed that the design value of the distance between a part exposed through an opening portion and a resist pattern is within a prescribed distance. In the present embodiment, $0.3 \times \lambda/NA$ is used as a prescribed distance, where $\lambda$, is a wavelength of a light source in exposure and NA is numerical aperture. The prescribed distance in the present embodiment is a dimension equivalent to a limit of resolution.

When the distance between the resist pattern corresponding portion and the opening portions arranged at the parts corresponding to the opposite sides of a resist pattern which is conventionally formed by the half tone-type mask is within the prescribed distance as described above, if the both of the opening portions on opposite sides of the resist pattern are same phase opening portions, one of them may be changed to a reverse phase opening portion.

FIG. 31 is an illustration of the step of setting a dummy active region in a corresponding part in the calculator. In the present embodiment, shifter arrangement DA (Design Automation) system is employed to set a same phase opening portion and a reverse phase opening portion in the region of opening portions of the Levenson-type mask.

An active region corresponding portion 44 is set corresponding to each of resist pattern corresponding portions 41, 42. Resist pattern corresponding portion 43 includes a first pattern corresponding portion 43a and second pattern corresponding portions 43b, 43c.

If at least one of the aforementioned distances L6 and L7 is within the above-noted prescribed distance, dummy active region 45 is set in the region where resist pattern corresponding portion 43 is formed. It is set such that an active region is virtually formed in a layer immediately below first pattern portion corresponding portion 43a of resist pattern corresponding portion 43. For example, dummy active region 45 is set as if first pattern portion corresponding portion 43a was a gate electrode.

By setting dummy active region 45, first pattern corresponding portion 43a is determined to have, for example, a gate electrode formed therein, and first pattern corresponding portion 43a is identified as a pattern to be formed by the Levenson-type mask. It is determined that in the Levenson-type mask a same phase opening portion and a reverse phase opening portion should be set on opposite sides of first pattern corresponding portion 43a. Reverse phase opening portion 31b and same phase opening portion 31c are expanded such that first pattern 13a is formed by exposure light transmitted through reverse phase opening portion 31b and same phase opening portion 31c shown in FIG. 30. The Levenson-type mask shown in FIG. 28 is formed based on the data of same phase opening portion and reverse phase opening portion.

In the present embodiment, a calculator program is used to set the kind and size of the opening portion of the Levenson-type mask. When the patterns formed in the element isolation regions include a part sandwiched between patterns formed by the Levenson-type mask and if within the above-noted prescribed distance, a dummy active region is set and the opening portion is expanded. By setting a dummy active region, the expanded same phase opening portion or reverse phase opening portion can easily be formed.

In the present embodiment, the calculator program determines that the same phase opening portion and the reverse phase opening portion should be increased in size so that the same phase opening portion and the reverse phase opening portion are expanded. The method of expanding the opening portions is not limited to this manner. The same phase opening portion and the reverse phase opening portion may be expanded by mutually coupling the opening portions in contact with each other where the same phase opening portion and the reverse phase opening portion are first set on opposite sides of the first pattern corresponding portion.

In the present embodiment, an interconnection pattern formed in the element isolation region is formed by the Levenson-type mask, thereby improving the dimensional accuracy of the above-noted interconnection pattern. In addition, the focus tolerance can be improved and circuit patterns can be formed at high yields.

In the diagrams of the foregoing embodiments, the same or corresponding parts are denoted with the same reference characters.

In accordance with the present invention, it is possible to provide a pattern formation method to allow formation of a minute pattern. It is also possible to provide a method of manufacturing a Levenson-type mask to allow formation of a minute pattern.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of forming a pattern including a first pattern and a second pattern having a first minimum dimension which is a minimum dimension of spanning dimensions and a third pattern having a second minimum dimension which is a minimum dimension of spanning dimensions, comprising:

a first exposure step of performing an exposure for forming said first pattern and said second pattern using a Levenson-type mask; and a second exposure step of performing an exposure for forming said third pattern using a half tone-type mask, wherein said Levenson-type mask comprises:

a transparent substrate and a light shielding film arranged on a main surface of said transparent substrate and having a plurality of opening portions, wherein said opening portions includes:

a first pair of a first same-phase opening portion and a first-reverse phase opening portion on opposite sides of said first pattern; and a second pair of a second same-phase opening portion and a second reverse-phase opening portion on opposite sides of said second pattern, wherein said first reverse-phase opening portion and said second reverse-phase opening portion have concave portions, and wherein said first or second same-phase opening portion is set in at least one of said opening portions that form said first and second pairs opposed to each other.

2. The method of forming the pattern according to claim 1, wherein each of said concave portions has an undercut portion formed to extend to below an end portion of said first or second reverse-phase opening portion.

3. The method of forming the pattern according to claim 1, wherein an exposure amount of said second exposure step is set to be at most an exposure amount of said first exposure step.

4. The method of forming the pattern according to claim 1, wherein said second minimum dimension is at least 1.0 time and at most 1.1 times said first minimum dimension, and an exposure amount of said first exposure step is set to be smaller than an exposure amount of said second exposure step.

* * * * *